(12) United States Patent
Hwang et al.

(10) Patent No.: US 8,278,664 B2
(45) Date of Patent: Oct. 2, 2012

(54) ORGANIC LIGHT EMITTING DISPLAY DEVICE AND METHOD OF FABRICATING THE SAME

(75) Inventors: Eui-Hoon Hwang, Suwon-si (KR); Sang-Gul Lee, Suwon-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 313 days.

(21) Appl. No.: 11/473,581

(22) Filed: Jun. 22, 2006

(65) Prior Publication Data
US 2006/0290828 A1  Dec. 28, 2006

(30) Foreign Application Priority Data

Jun. 22, 2005  (KR) .................. 10-2005-0054165

(51) Int. Cl.
*H01L 29/786* (2006.01)
(52) U.S. Cl. ............ 257/72; 257/40; 257/59; 257/60; 257/E51.005; 257/E51.018; 257/E33.064; 349/147; 438/149
(58) Field of Classification Search .......... 257/72, 257/E51.005, 40, 59, 60, 66, E51.018, E33.064, 257/E23.142; 438/149; 349/139, 147
See application file for complete search history.

(56) References Cited

U.S. PATENT DOCUMENTS

| | | | |
|---|---|---|---|
| 6,037,195 A | 3/2000 | Toriyama et al. | |
| 6,690,033 B2 * | 2/2004 | Yamazaki et al. | 257/72 |
| 6,759,678 B2 * | 7/2004 | Yamazaki et al. | 257/59 |
| 6,872,607 B2 * | 3/2005 | Tanaka | 438/166 |
| 7,129,102 B2 * | 10/2006 | Yamazaki | 438/22 |
| 2002/0104995 A1 | 8/2002 | Yamazaki et al. | |
| 2003/0127652 A1 | 7/2003 | Park et al. | |
| 2003/0197208 A1 * | 10/2003 | Yamazaki et al. | 257/288 |
| 2004/0256979 A1 | 12/2004 | Murakami et al. | |
| 2006/0043373 A1 | 3/2006 | Wu et al. | |

FOREIGN PATENT DOCUMENTS

| | | |
|---|---|---|
| CN | 1457220 | 11/2003 |
| CN | 1525554 | 9/2004 |
| JP | 2000-150906 | 5/2000 |
| JP | 2001-024196 | 1/2001 |
| JP | 2001-291595 | 10/2001 |
| JP | 2002-076352 | 3/2002 |
| JP | 2002-149112 | 5/2002 |
| JP | 2003-123965 | 4/2003 |
| JP | 2004-214010 | 7/2004 |
| JP | 2005-150087 | 9/2005 |

(Continued)

OTHER PUBLICATIONS

European Search Report (a counterpart EP Application No. 06115788.9).

(Continued)

*Primary Examiner* — Matthew E Warren
*Assistant Examiner* — John Lin
(74) *Attorney, Agent, or Firm* — Knobbe, Martens, Olson & Bear LLP

(57) ABSTRACT

Provided are an organic light emitting display device (OLED) and a method of fabricating the same. When a electrically conductive line and a gate electrode are formed at the same time or when a first electrode is formed, interconnections for electrically connecting elements are formed. Thus, the number of used masks can be reduced, so that the overall fabrication process can be shortened and the production cost can be reduced.

14 Claims, 28 Drawing Sheets

FOREIGN PATENT DOCUMENTS

| | | |
|---|---|---|
| KR | 10-2002-0080866 | 10/2002 |
| KR | 10-2003-0031650 | 4/2003 |
| KR | 10-2003-0037876 | 5/2003 |
| KR | 10-2004-0033395 | 4/2004 |
| KR | 10-2005-0068142 | 7/2005 |
| TW | 473633 | 1/2002 |

OTHER PUBLICATIONS

Chinese Office Action and translation issued Apr. 18, 2008 in corresponding Chinese Patent Application No. 200610125721.0.
Chinese Certificate CN 100481489C for Chinese Patent App. No. 200610125721.0.
Japanese Office Action issued on Jul. 28, 2009 in the corresponding Japanese Patent Application No. 2006-172908.

* cited by examiner

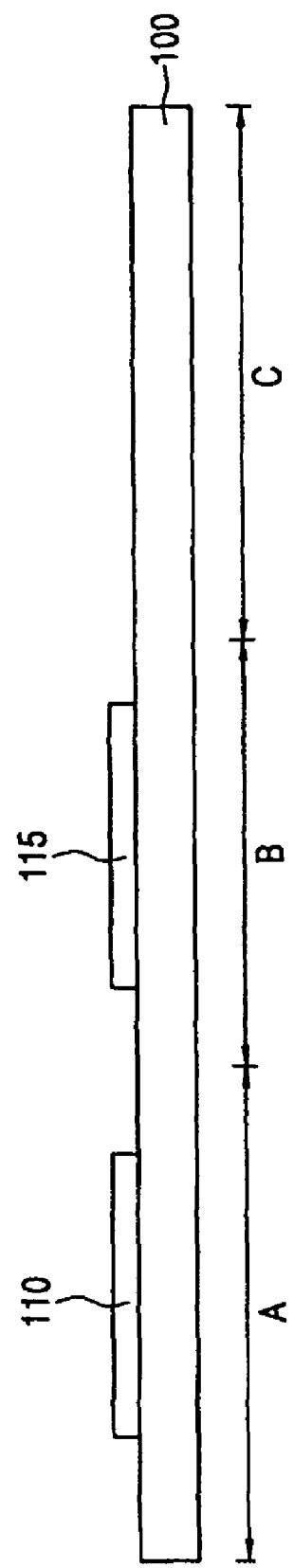

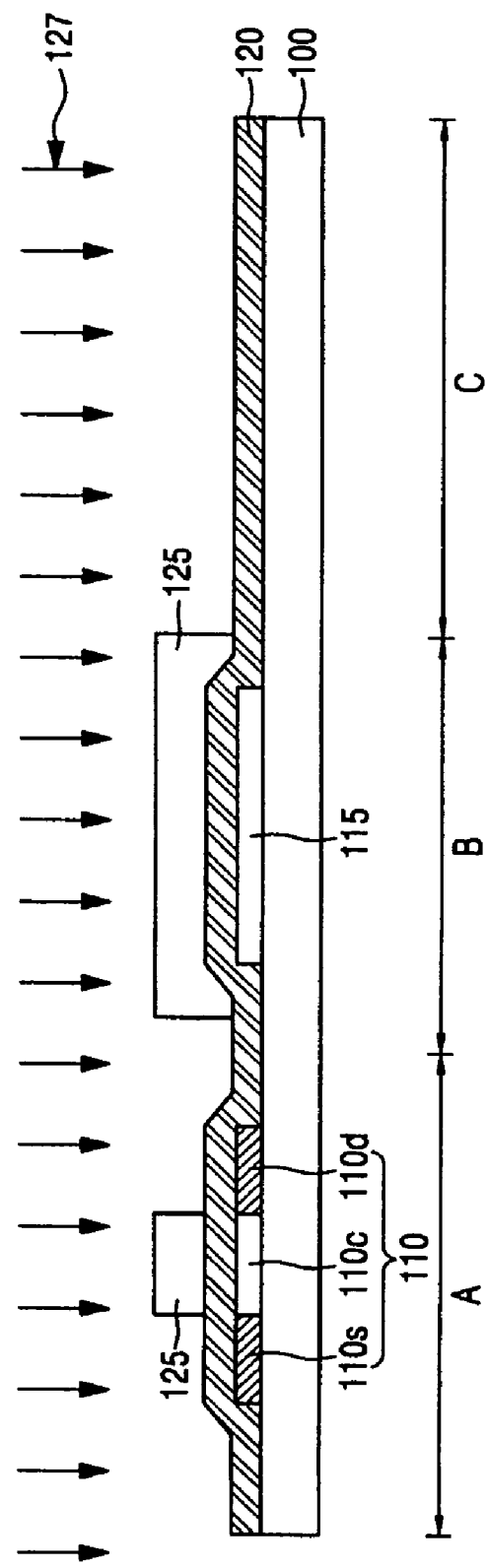

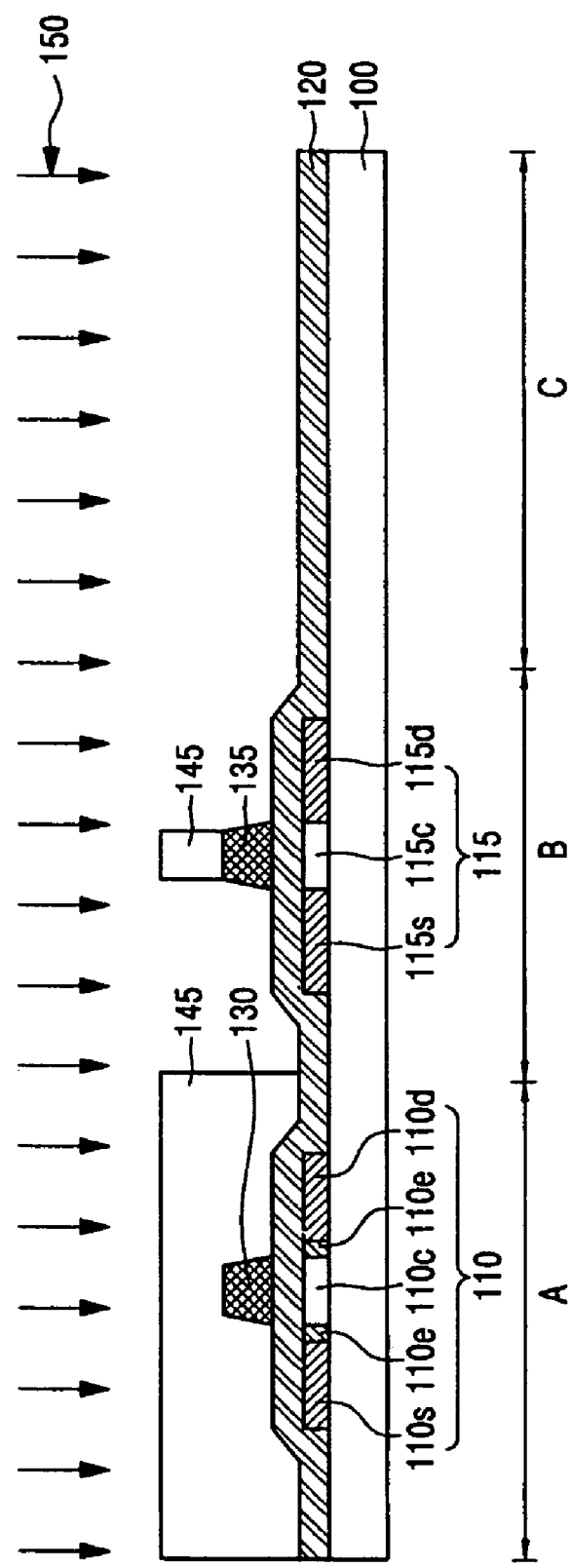

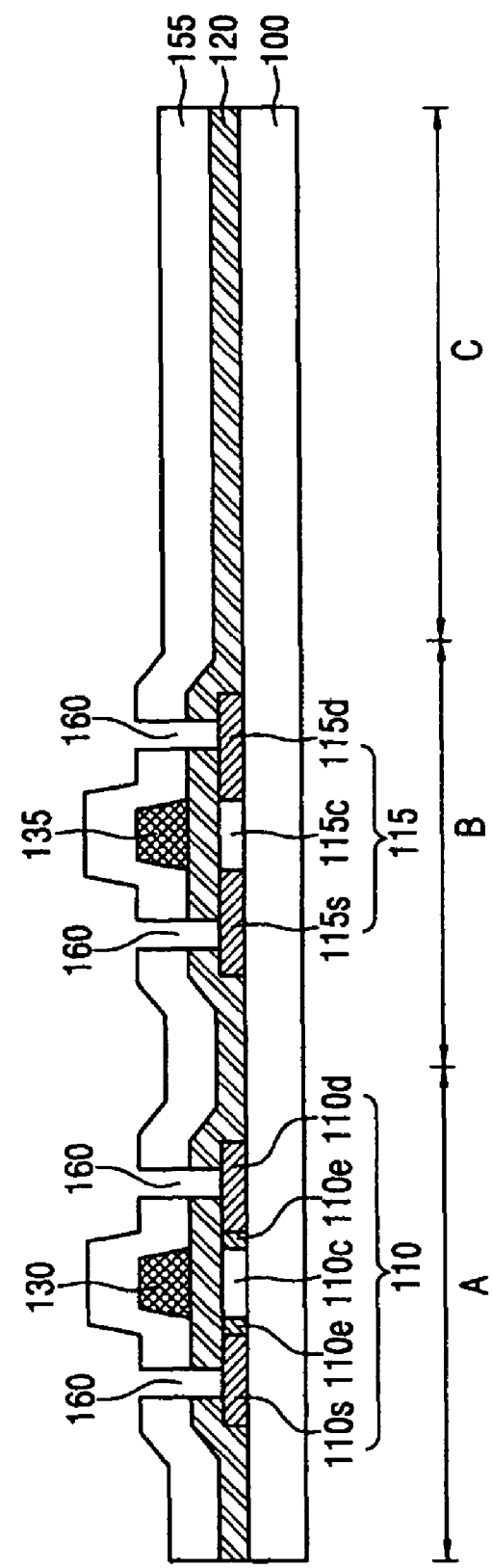

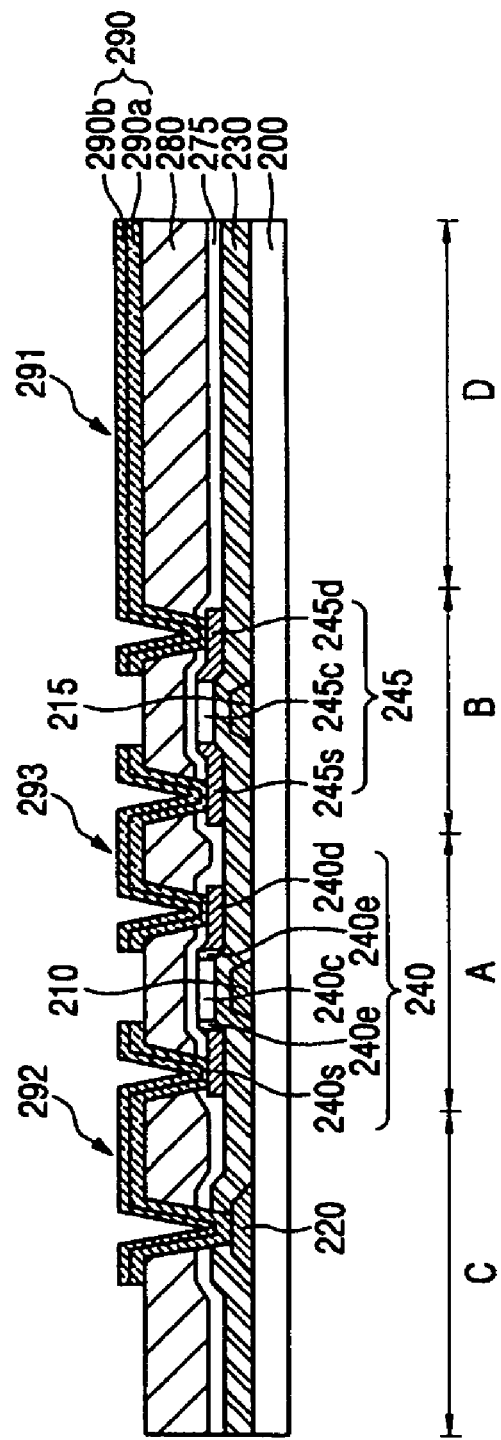

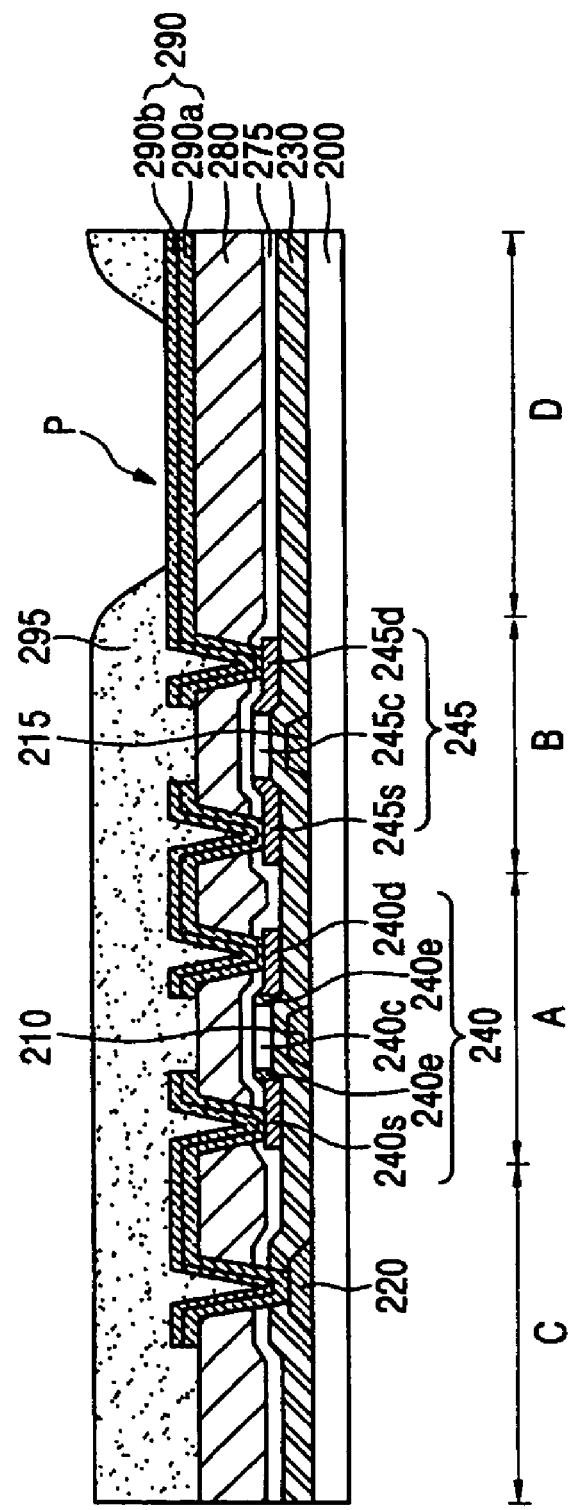

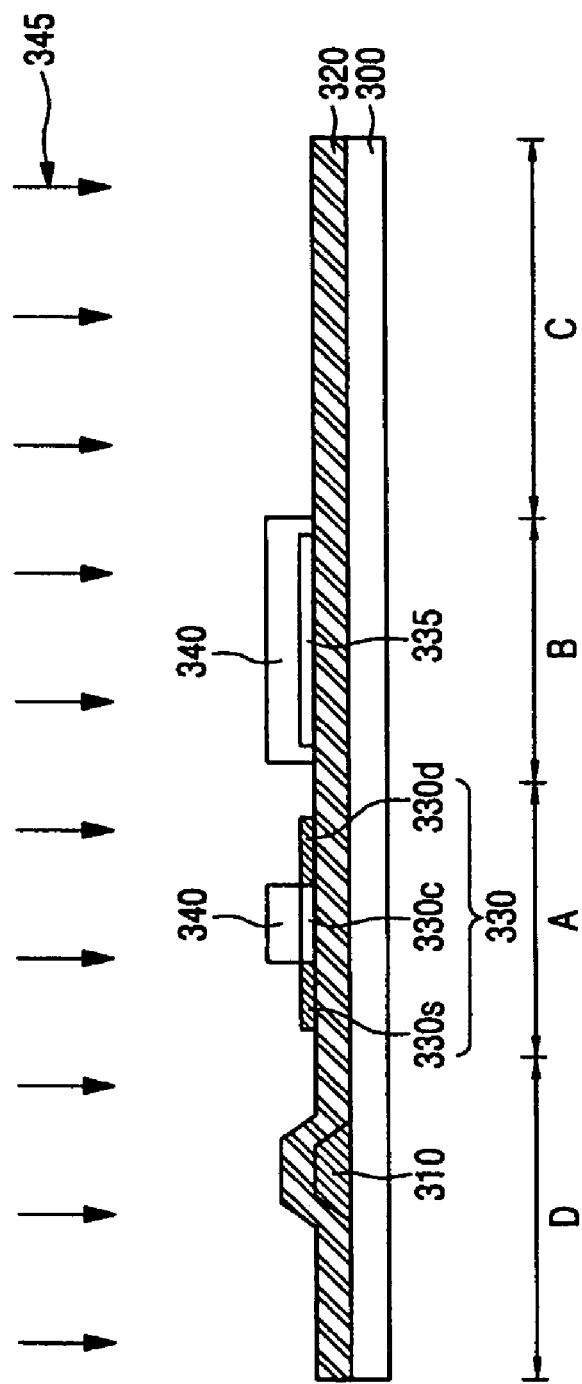

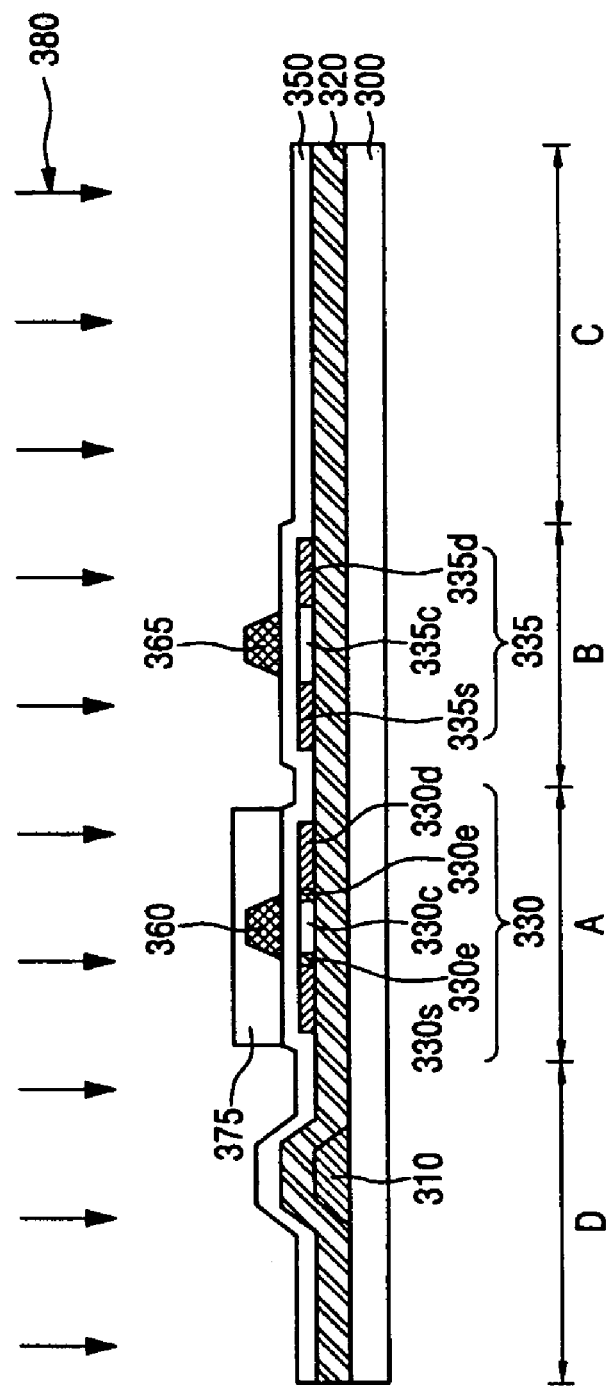

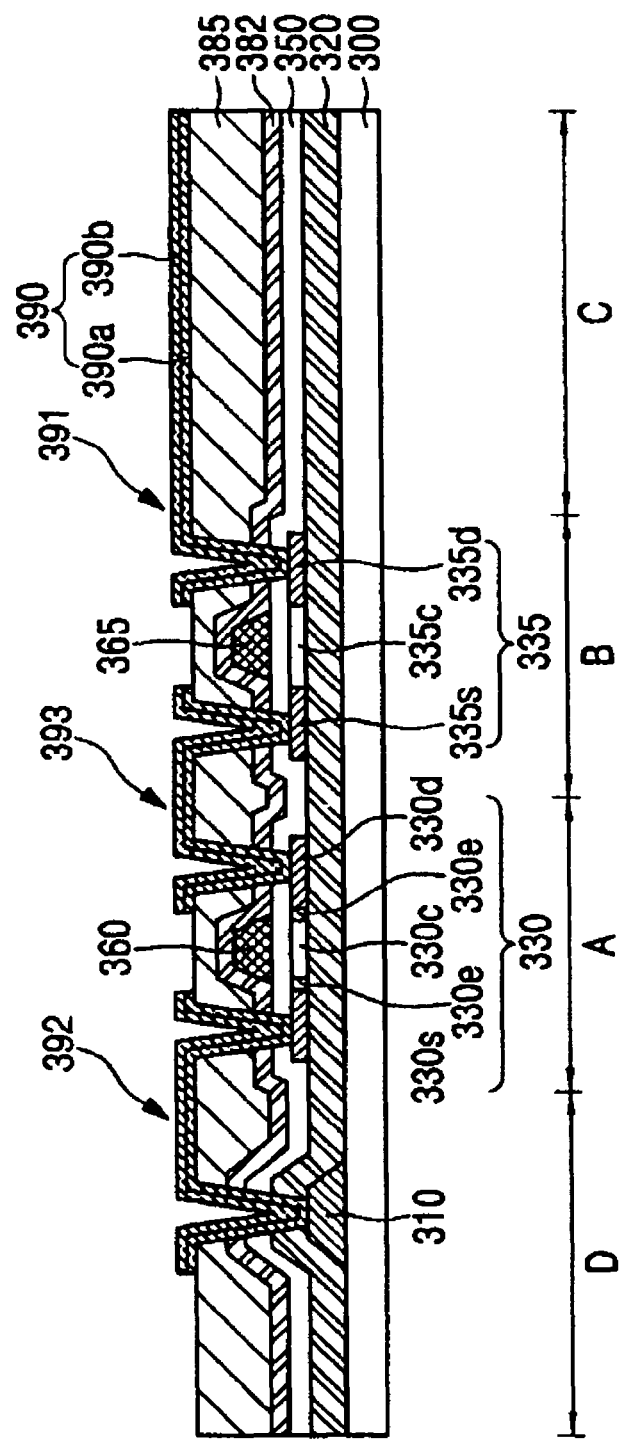

ORGANIC LIGHT EMITTING DISPLAY DEVICE AND METHOD OF FABRICATING THE SAME

CROSS-REFERENCE TO RELATED APPLICATIONS

This application claims priority to and the benefit of Korean Patent Application No. 10-2005-0054165, filed on Jun. 22, 2005, the disclosure of which is incorporated herein by reference in its entirety.

BACKGROUND OF THE INVENTION

1. Field of the Invention

The present invention relates to an organic light emitting display device (OLED) and a method of fabricating the same.

2. Description of the Related Technology

Among flat panel display devices (FPDs), an organic light emitting display device (OLED) is an emissive device that has a wide viewing angle and a fast response speed of 1 ms or less. The OLED can be fabricated to a small thickness at a low cost and has good contrast.

The OLED has an organic emission layer (EML) interposed between an anode and a cathode. Holes transported from the anode combine with electrons transported from the cathode to form hole-electron pairs, i.e., excitons. The OLED emits light by energy generated while the excitons transition from an excited state to a ground state.

In general, since each pixel of the OLED includes a thin film transistor (TFT), a constant current may be supplied to pixels irrespective of the number of pixels of the OLED. Thus, the OLED can emit light with stable luminance and consume small power. For this reason, the OLED is suitable for high-resolution large-sized display devices.

SUMMARY OF CERTAIN INVENTIVE ASPECTS

One aspect of the invention provides a flat panel display device. The device comprises: a substrate; a first thin film transistor formed over the substrate; an electrically conductive line formed over the substrate; a planarization layer formed over the first thin film transistor and the electrically conductive line; and a first interconnection electrically interconnecting the electrically conductive line and the first thin film transistor, wherein the first interconnection comprises: a first portion formed over the planarization layer, a second portion connecting between the first portion and the electrically conductive line through the planarization layer, and a third portion connecting between the first portion and a portion of the first thin film transistor.

The thin film transistor may comprise a source, a drain and a channel located therebetween, wherein the portion of the thin film transistor may comprise the source or the drain. The first thin film transistor may comprise a gate electrode, and the electrically conductive line may be formed simultaneously with the gate electrode. The device may further comprise a second thin film transistor formed between the substrate and the planarization layer. The first thin film transistor may comprise an NMOS transistor, and the second thin film transistor may comprise a PMOS transistor.

The device may further comprise a second interconnection electrically interconnecting the first thin film transistor and the second thin film transistor, and the second interconnection may comprise: a first portion formed over the planarization, a second portion connecting between the first portion and the first thin film transistor through the planarization layer, and a third portion connecting between the first portion and the second thin film transistor.

The device may further comprise a pixel electrode and a second interconnection, wherein the pixel electrode is formed over the planarization layer, and wherein the second interconnection electrically interconnects the pixel electrode and the first or second thin film transistor, the second interconnection comprising a portion formed through the planarization layer.

The device may further comprise an organic light emitting layer over the pixel electrode. The first interconnection may comprise a material, and the pixel electrode may comprise the same material. The second interconnection may comprise a material, and the pixel electrode may comprise the same material. The pixel electrode and the second interconnection may be continuous. The second interconnection may comprise a first layer comprising a first material and a second layer comprising a second material, and the pixel electrode may comprise a first layer comprising the first material and a second layer comprising the second material. The first material may comprise one or more selected from the group consisting of Al, Ag, an Al alloy, and an Ag alloy. The second material may comprise ITO or IZO.

Another aspect of the invention provides a method of making a flat panel display device. The method comprises: providing a device comprising a substrate, an electrically conductive line formed over the substrate, and a first thin film transistor (TFT) formed over the substrate; forming a planarization layer over the electrically conductive line and the first TFT; forming a first via through the planarization layer so as to expose a portion of the first TFT; forming a second via through the planarization layer so as to expose a portion of the electrically conductive line; and forming a first interconnection between the first TFT and the electrically conductive line, the first interconnection comprising a first portion formed over the planarization layer, a second portion connecting the first portion and the first TFT through the first via, and a third portion connecting the first portion and the electrically conductive line.

In the method, providing the device may comprise: providing the substrate; forming the electrically conductive line; and forming a gate electrode of the first TFT, wherein the gate electrode and the electrically conductive line are simultaneously formed. The device may further comprise a second thin film transistor formed between the substrate and the planarization layer, and the method may further comprise: forming a third via through the planarization layer so as to expose another portion of the first TFT; forming a fourth via through the planarization layer so as to expose a portion of the second TFT; and forming a second interconnection between the first TFT and the second TFT, the second interconnection comprising a first portion formed over the planarization layer, a second portion connecting the first portion and the first TFT through the third via, and a third portion connecting the first portion and the second TFT through the fourth via.

The method may further comprise forming a fifth via through the planarization layer so as to expose another portion of the second TFT; forming a pixel electrode over the planarization layer; and forming a third interconnection electrically interconnecting the second TFT and the pixel electrode, wherein the third interconnection may comprise a portion formed through the fifth via. At least part of the third interconnection may be simultaneously formed with at least part of the pixel electrode. At least part of the pixel electrode may be simultaneously formed with at least part of the first or second interconnection.

Another aspect of the invention provides an organic light emitting display device (OLED) and a method of fabricating the same in which when an electrically conductive line and a gate electrode are formed at the same time or when a first electrode is formed, interconnections for electrically connecting elements are formed, so that an overall fabrication process is shortened and the production cost is reduced by a decrease in the number of used masks.

Yet another aspect of the invention provides an OLED which includes: a substrate having a first thin film transistor (TFT), a second TFT, and an electrically conductive line; a planarization layer disposed on the substrate having the first TFT, the second TFT, and the electrically conductive line; contact holes disposed in predetermined regions of the planarization layer to expose predetermined regions of first source and drain regions of the first TFT, second source and drain regions of the second TFT, and the electrically conductive line; and an interconnection for electrically connecting the electrically conductive line, the first source and drain regions, and the second source and drain regions through the contact holes.

Another aspect of the invention provides an OLED which includes: an electrically conductive line, a first gate electrode, and a second gate electrode disposed on a substrate; a gate insulating layer disposed on the electrically conductive line, the first gate electrode, and the second gate electrode; a first semiconductor layer and a second semiconductor layer disposed on the gate insulating layer, the first semiconductor layer corresponding to the first gate electrode and including first source and drain regions and a first channel region, the second semiconductor layer corresponding to the second gate electrode and including second source and drain regions and a second channel region; a planarization layer disposed on the first semiconductor layer and the second semiconductor layer; contact holes formed by etching predetermined regions of the planarization layer and exposing predetermined regions of the electrically conductive line, the first source and drain regions, and the second source and drain regions; a first interconnection for connecting the electrically conductive line with one of the first source and drain regions through the contact holes, a second interconnection for connecting the other of the first source and drain regions with one of the second source and drain regions through the contact holes, and a first electrode connected to the other of the second source and drain regions through the contact holes; a pixel defining layer disposed on the first interconnection, the second interconnection, and the first electrode and exposing a predetermined region of the first electrode; and an organic layer and a second electrode disposed on the exposed region of the first electrode, the organic layer including at least an organic emission layer (EML).

Still another aspect of the invention provides an OLED which includes: an electrically conductive line disposed on a substrate; a buffer layer disposed on the electrically conductive line; a first semiconductor layer and a second semiconductor layer disposed on the buffer layer, the first semiconductor layer including first source and drain regions and a first channel region, the second semiconductor layer including second source and drain regions and a second channel region; a gate insulating layer disposed on the first semiconductor layer and the second semiconductor layer; a first gate electrode and a second gate electrode disposed on the gate insulating layer and corresponding to the first channel region and the second channel region, respectively; a planarization layer disposed on the first gate electrode and the second gate electrode; contact holes formed by etching predetermined regions of the planarization layer and the gate insulating layer to expose predetermined regions of the first source and drain regions and the second source and drain regions, and formed by etching predetermined regions of the planarization layer, the gate insulating layer, and the buffer layer to expose predetermined regions of the electrically conductive line; a first interconnection for connecting the electrically conductive line with one of the first source and drain regions through the contact holes, a second interconnection for connecting the other of the first source and drain regions with one of the second source and drain regions through the contact holes, and a first electrode connected to the other of the second source and drain regions through the contact holes; a pixel defining layer disposed on the first interconnection, the second interconnection, and the first electrode and exposing a predetermined region of the first electrode; and an organic layer and a second electrode disposed on the exposed region of the first electrode, the organic layer including at least an organic emission layer.

Yet another aspect of the invention provides a method of fabricating an OLED which includes: forming an electrically conductive line on a substrate; forming a buffer layer on the electrically conductive line; forming a first semiconductor layer and a second semiconductor layer on the buffer layer; forming a gate insulating layer on the first semiconductor layer and the second semiconductor layer; forming a first gate electrode and a second gate electrode on the gate insulating layer such that the first gate electrode and the second gate electrode correspond to a first channel region of the first semiconductor layer and a second channel region of the second semiconductor layer, respectively; forming a planarization layer on the first gate electrode and the second gate electrode; forming contact holes exposing predetermined regions of first source and drain regions of the first semiconductor layer and predetermined regions of second source and drain regions of the second semiconductor layer by etching predetermined regions of the planarization layer and the gate insulating layer, and exposing predetermined regions of the electrically conductive line by etching predetermined regions of the planarization layer, the gate insulating layer, and the buffer layer; forming a reflective layer and a transparent layer on the substrate having the contact holes; forming a first interconnection, a second interconnection, and a first electrode by patterning the reflective layer and the transparent layer, the first interconnection for connecting the electrically conductive line with one of the first source and drain regions, the second interconnection for connecting the other of the first source and drain regions with one of the second source and drain regions, the first electrode connected to the other of the second source and drain regions; forming a pixel defining layer on the substrate having the first interconnection, the second interconnection, and the first electrode to expose a predetermined region of the first electrode; and forming an organic layer having at least an organic emission layer and a second electrode on the exposed region of the first electrode.

BRIEF DESCRIPTION OF THE DRAWINGS

The above and other features of the invention will be described in reference to certain exemplary embodiments thereof with reference to the attached drawings in which:

FIGS. 1A through 1K are cross-sectional views illustrating an organic light emitting display device (OLED) having a top gate type CMOS thin film transistor (TFT) and a method of fabricating the same;

FIGS. 2A through 2H are cross-sectional views illustrating an OLED having a bottom gate type CMOS TFT and a method of fabricating the same according to an embodiment; and FIGS. 3A through 3I are cross-sectional views illustrating an OLED having a top gate type CMOS TFT and a method of fabricating the same according to another embodiment.

DETAILED DESCRIPTION OF CERTAIN INVENTIVE EMBODIMENTS

Figure 1C:
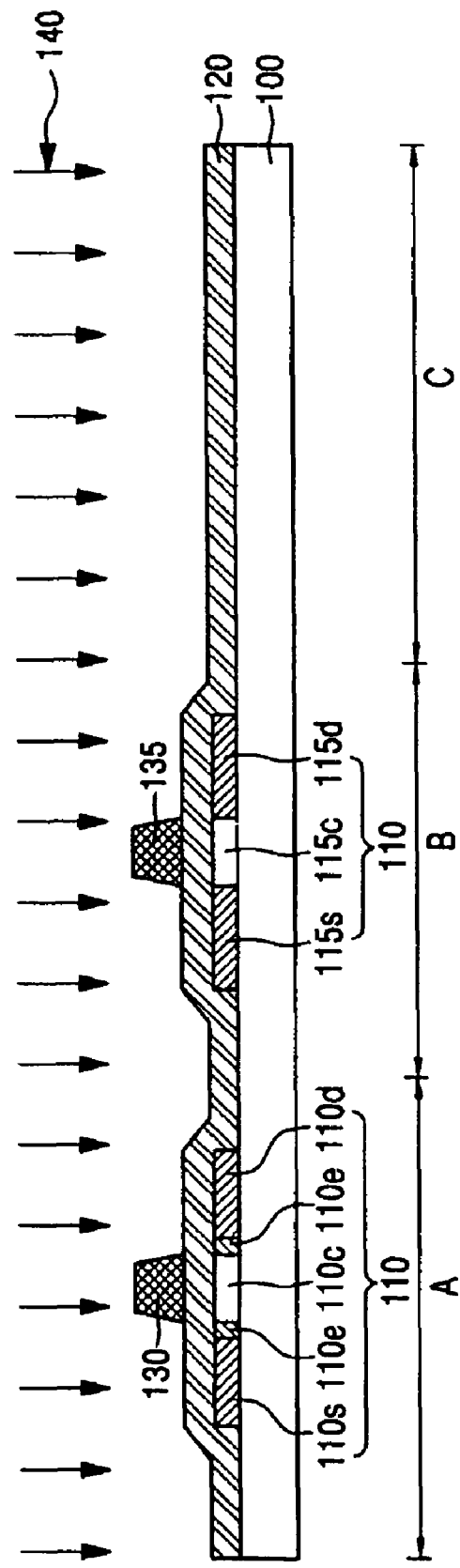

The invention will now be described more fully hereinafter with reference to the accompanying drawings, in which exemplary embodiments of the invention are shown. In the drawings, the thicknesses of layers and regions are exaggerated for clarity. The same reference numerals are used to denote the same elements throughout the specification.

FIGS. 1A through 1K are cross-sectional views illustrating an OLED having a top gate type CMOS TFT and a method of fabricating the same. Referring to FIG. 1A, the OLED has a top gate type complementary metal oxide semiconductor (CMOS) TFT. The OLED includes a substrate 100 having a first TFT region A, a second TFT region B, and an opening region C. An amorphous silicon (a-Si) layer is deposited on the substrate 100, crystallized by a crystallization method, and then is patterned using a first mask (not shown), thereby forming a first semiconductor layer 110 and a second semiconductor layer 115.

Typically, the mask is used to form a photoresist (PR) pattern during a photolithography process. An etching process is performed using the formed PR pattern. Thereafter, the PR pattern is removed by an ashing process using a dry etching process. After the ashing process, the remaining PR is entirely removed by a PR stripping process.

Referring to FIG. 1B, a gate insulating layer 120 is formed over the substantially entire surface of the substrate 100 having the first and second semiconductor layers 110 and 115. A first PR pattern 125 is formed using a second mask (not shown) over the first and second semiconductor layers 110 and 115 in the first and second TFT regions A and B.

A first impurity implantation process 127 may be performed to implant n-type impurity ions, such as P ions, As ions, Sb ions, or Bi ions, into the first semiconductor layer 110 of the first TFT region A. Thus, the first semiconductor layer 110 of the first TFT region A forms an NMOS transistor including first source and drain regions 110s and 110d and a first channel region 110c, which is interposed between the first source and drain regions 110s and 110d.

Referring to FIG. 1C, a gate electrode material is deposited on the gate insulating layer 120 in the first and second TFT regions A and B and then is patterned using a third mask (not shown), thereby forming a first gate electrode 130 and a second gate electrode 135. The first and second gate electrodes 130 and 135 overlap with the first channel region 110c and a second channel region 115c of the first and second semiconductor layers 110 and 115, respectively. The first gate electrode 130 may be patterned to a smaller size than the first channel region 110c of the first semiconductor layer 110 in the first TFT region A. A second impurity implantation process 140 is performed using the first gate electrode 130 as a mask, thereby forming lightly doped drain (LDD) regions 110e in predetermined regions of the first channel region 110c of the first semiconductor layer 110. Thus, the first semiconductor layer 110 of the first TFT region A includes the first source and drain regions 110s and 110d doped with n-type impurity ions, the LDD regions 110e, and the first channel region 110c which is interposed between the LDD regions 110e. Also, as a result of the second impurity implantation process 140, the semiconductor layer 115 of the second TFT region B includes second source and drain regions 115s and 115d and the second channel region 115c.

Referring to FIG. 1D, a second photoresist pattern 145 is formed using a fourth mask (not shown) to completely cover the first TFT region A and cover only the second gate electrode 135 in the second TFT region B. A third impurity implantation process 150 is then performed so that p-type impurity ions, such as B ions, Al ions, Ga ions, or In ions are implanted into the second source and drain regions 115s and 115d of the second TFT region B. In this case, the p-type impurity ions are implanted into the second source and drain regions 115s and 115d of the second TFT region B at a higher concentration than the LDD regions 110e. Accordingly, the second semiconductor layer 115 of the second TFT region B forms a PMOS transistor including the second source and drain regions 115s and 115d and the second channel region 115c. Through these steps, a CMOS transistor having both the NMOS transistor and the PMOS transistor is formed.

Referring to FIG. 1E, an interlayer insulating layer 155 is formed on the substantially entire surface of the substrate 100 having the first and second gate electrodes 130 and 135. Contact holes 160 are formed using a fifth mask (not shown) in the interlayer insulating layer 155 formed in the first and second TFT regions A and B to expose portions of the first and second source and drain regions 110s, 110d, 115s, and 115d.

Figure 1F:
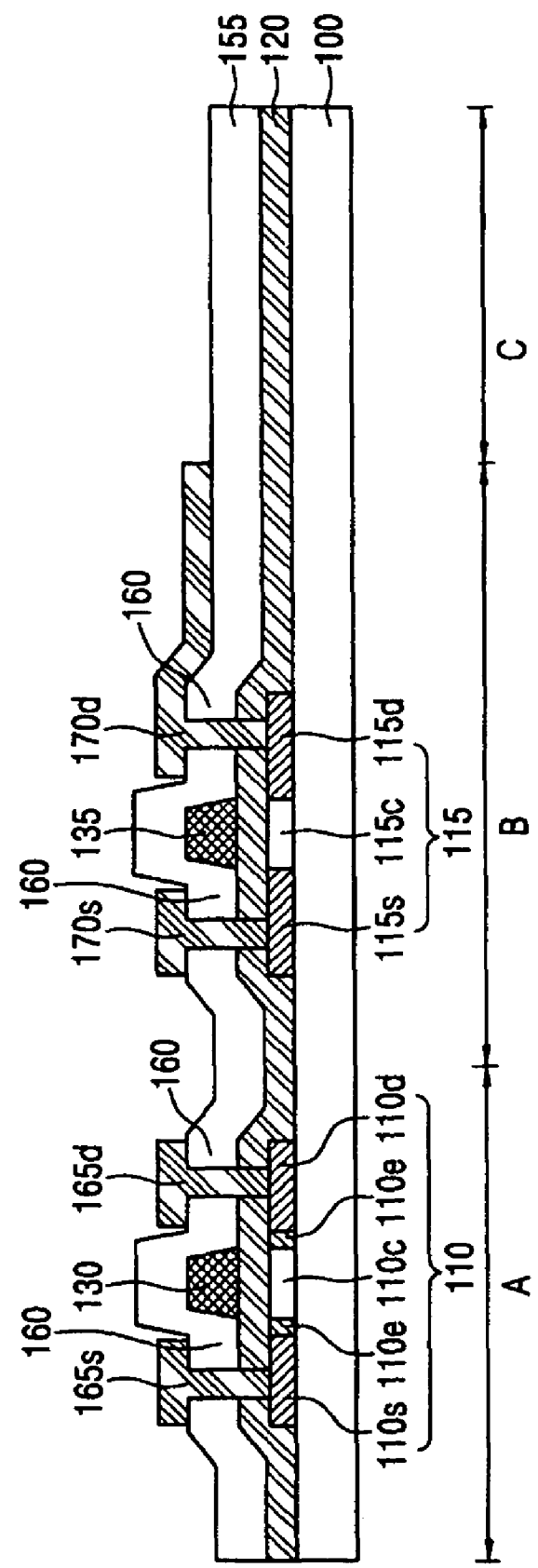

Referring to FIG. 1F, source and drain electrode materials are deposited through the contact holes 160 of the interlayer insulating layer 155 and then are patterned using a sixth mask (not shown), thereby forming first and second source and drain electrodes 165s, 165d, 170s, and 170d. The electrodes 165s, 165d, 170s, and 170d are in contact with the first and second source and drain regions 110s, 110d, 115s, and 115d of the first and second semiconductor layers 110 and 115, respectively.

Figure 1G:
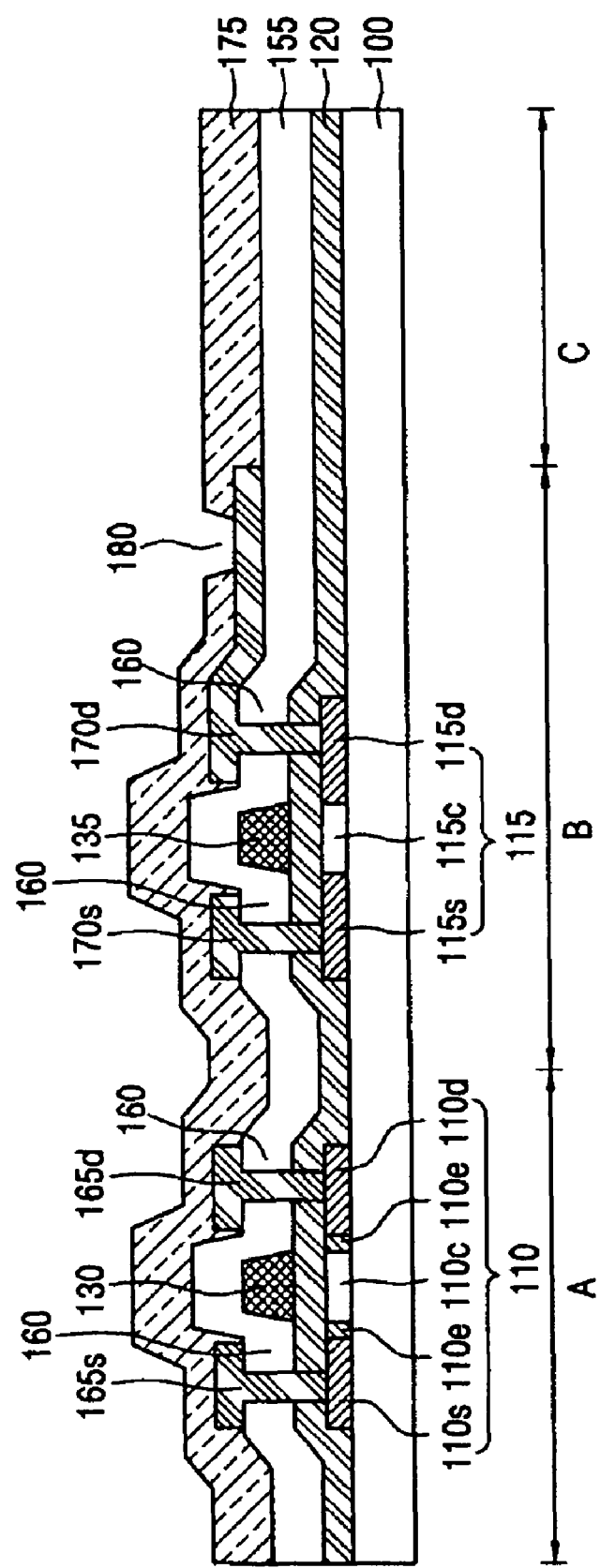

Referring to FIG. 1G, a passivation layer 175 is formed over the substantially entire surface of the substrate 100 having the first and second source and drain electrodes 165s, 165d, 170s, and 170d. By performing an etching process using a seventh mask (not shown), a first via hole 180 is formed in the passivation layer 175 formed in the opening region C.

Figure 1H:
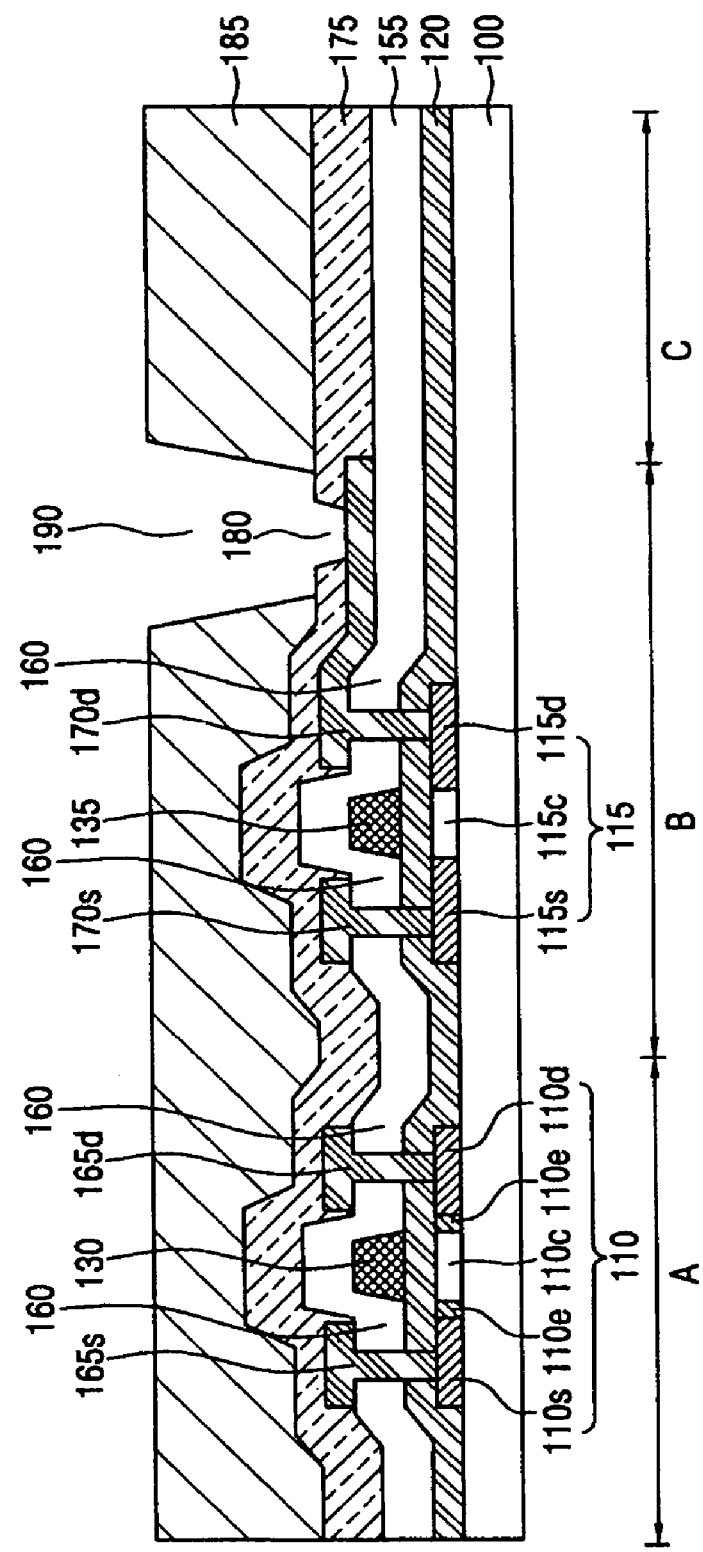
Figure 11:
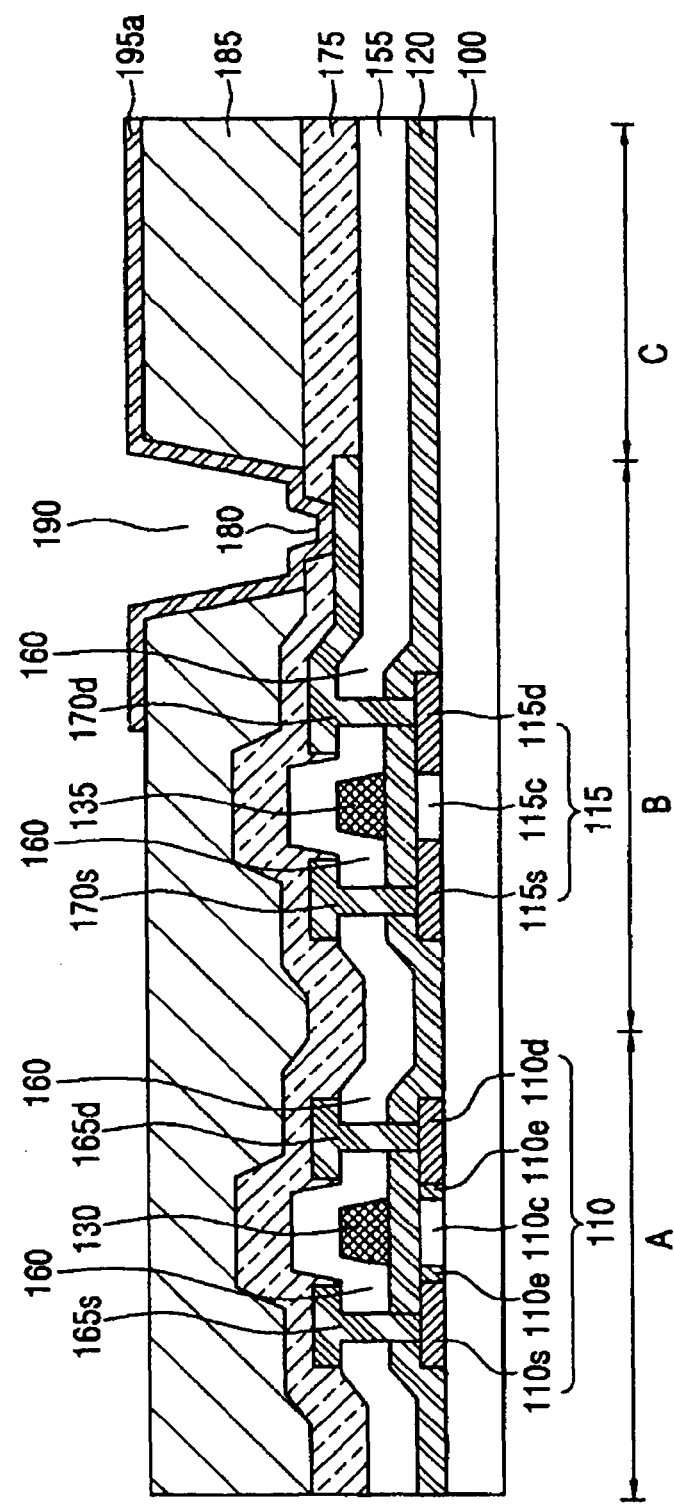

Referring to FIG. 1H, a planarization layer 185 is formed over the substantially entire surface of the substrate 100 having the passivation layer 175 with the first via hole 180 to fill steps. By performing a wet etching process using an eighth mask (not shown) and an etchant having a high etch selectivity with respect to the planarization layer 185, a second via hole 190 is formed in the planarization layer 185 of the opening region C.

Figure 1J:
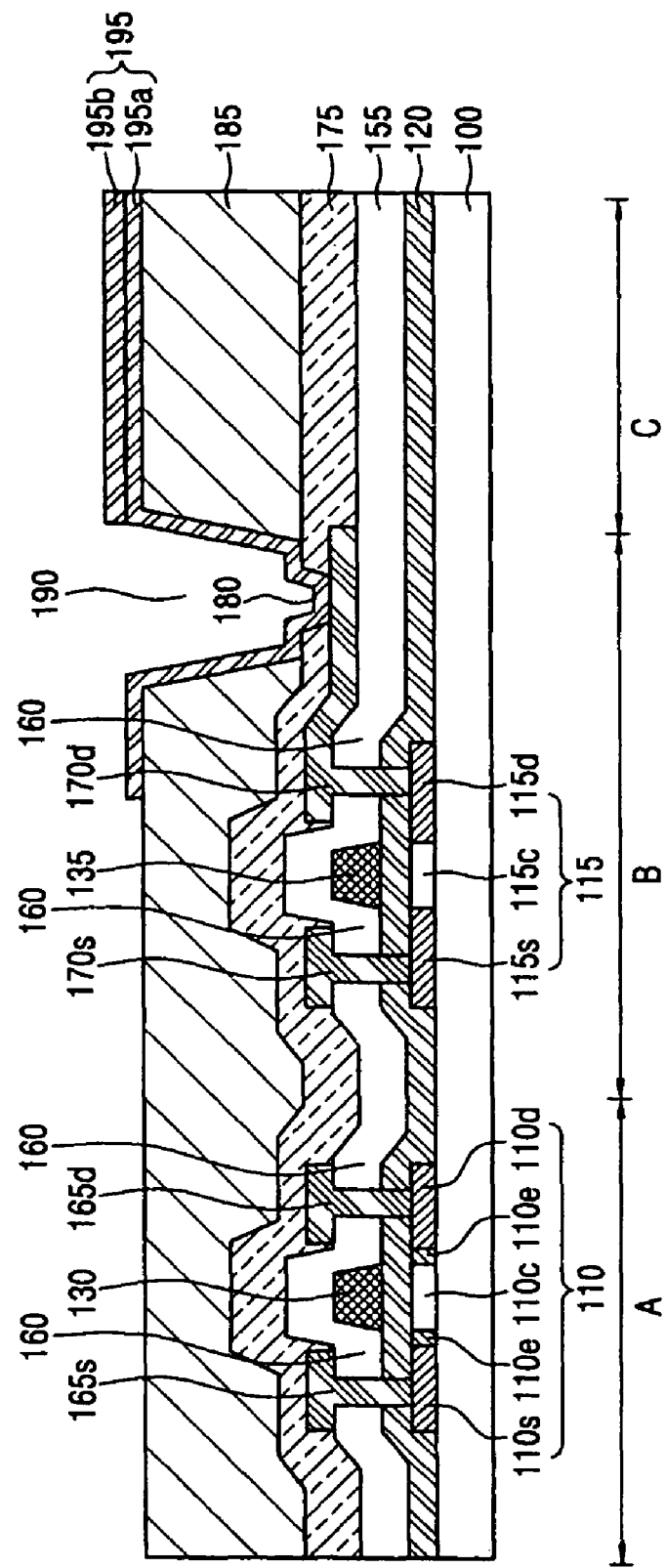

Referring to FIGS. 1I and 1J, a first electrode 195 is formed around the second via hole 190 and on inner walls and bottom surfaces of the first and second via holes 180 and 190 of the opening region C. The first electrode 195 serves as a reflective anode. The first electrode 195 may include a transparent electrode 195b and a reflective layer 195a with high reflectance. Referring to FIG. 1I, the reflective layer 195a of the first electrode 195 is formed by depositing and then patterning aluminum (Al) using a ninth mask (not shown). Referring to FIG. 1J, the transparent electrode 195b is formed by depositing indium tin oxide (ITO) or indium zinc oxide (IZO) on the reflective layer 195a and then patterning the deposited material through a wet or dry etching process using a tenth mask (not shown).

Figure 1K:
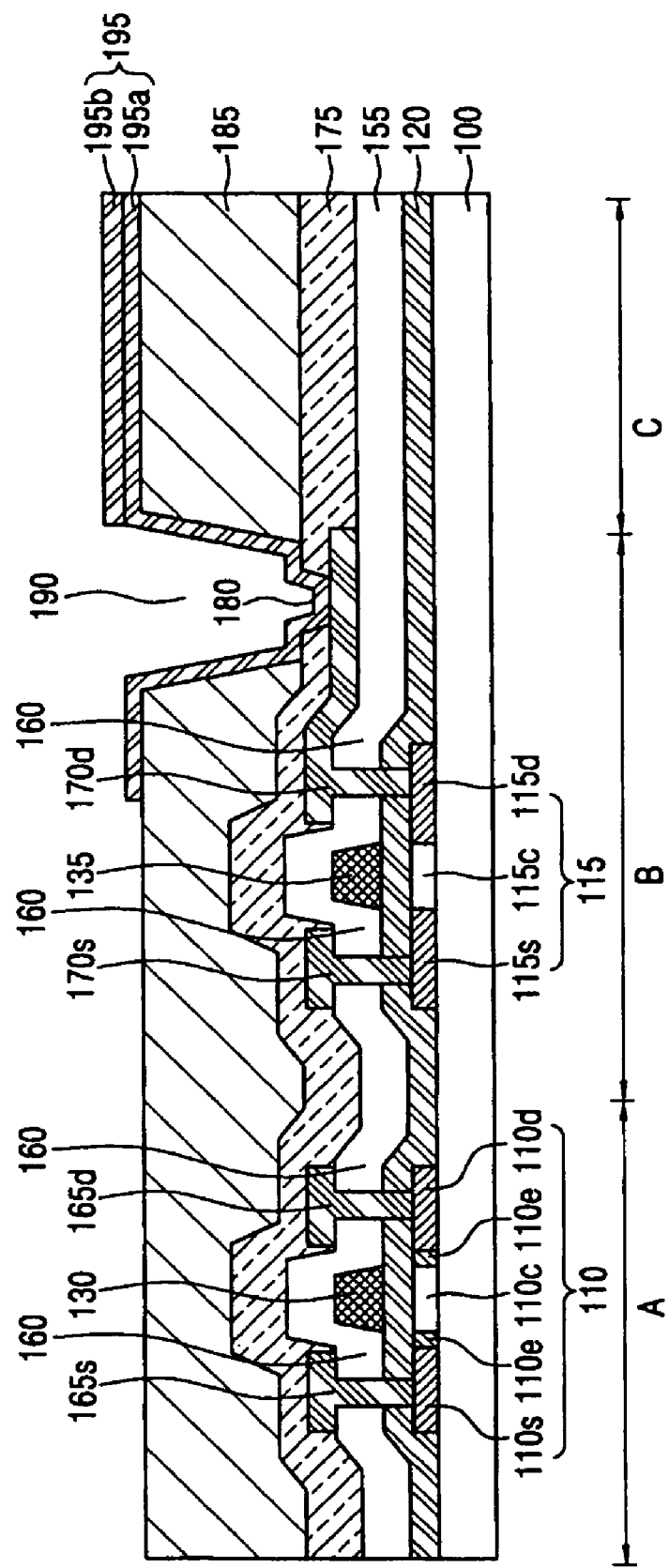

Referring to FIG. 1K, a pixel defining layer (not shown) is deposited over the substantially entire surface of the substrate 100 having the first electrode 195. The pixel defining layer (not shown) is then patterned using an eleventh mask (not shown), thereby forming an opening P to expose a portion of the surface of the first electrode 195.

An organic layer (not shown) having at least an emission layer is formed on the exposed surface of the first electrode 195. A second electrode (not shown) is deposited over the substantially entire surface of the substrate 100 having the organic layer. The second electrode is a thin transmissive electrode, which may be formed of one or more selected from the group consisting of Mg, Ca, Al, Ag, and an alloy thereof.

The substrate 100 having the second electrode is encapsulated with an upper substrate by any suitable sealing method, thereby completing a top-emitting OLED having a top gate type CMOS TFT. The CMOS TFT includes LDD regions in an NMOS transistor.

Also, a method of fabricating an OLED having a bottom gate type CMOS TFT with the LDD regions is similar to the above-described method of fabricating the OLED having the top gate type CMOS TFT with the LDD regions.

First, a gate electrode material is deposited in a first TFT region and a second TFT region of a substrate, and then is patterned using a first mask, thereby forming a gate electrode. A gate insulating layer is formed over the substrate and the gate electrode. A semiconductor layer is formed over the gate insulating layer, and then is patterned using a second mask. N-type impurity ions are implanted using a third mask into the semiconductor layer in the first TFT region, thereby forming an NMOS region. Also, LDD impurity ions are implanted using a fourth mask to form the LDD regions. Thereafter, p-type impurity ions are implanted using a fifth mask into the semiconductor layer in the second TFT region, thereby forming a PMOS region. As a result, a CMOS transistor having both an NMOS transistor with the LDD regions and a PMOS transistor is obtained.

Thereafter, formation of a contact hole in an interlayer insulating layer using a sixth mask, patterning of source and drain electrodes using a seventh mask, formation of a first via hole using an eighth mask, formation of a second via hole using a ninth mask, patterning of a reflective layer of a first electrode using a tenth mask, patterning of a transparent electrode of the first electrode using an eleventh mask, and formation of a pixel defining layer having an opening using a twelfth mask are the same as the above-described method of fabricating the OLED having the top gate type CMOS TFT. That is, a process for making an OLED having a bottom gate type CMOS TFT with the LDD regions involves twelve masking steps.

As described above, the fabrication of the OLED having the top gate type or bottom gate type CMOS TFT with the LDD regions requires relatively many process steps because a PMOS TFT and an NMOS TFT are formed on a single substrate, a via hole is patterned twice, and a first electrode is also patterned twice. Although the LDD regions are formed to reduce a leakage current of the NMOS TFT and prevent a hot carrier effect caused by device miniaturization, the formation of the LDD regions may result in a further increase in the number of masks used to fabricate the CMOS TFT.

The OLED having the top gate type or bottom gate type CMOS TFT with the LDD regions is obtained by performing eleven to twelve masking steps. As a result, an overall process tact time is extended, and the process becomes complicated. In addition, the yield decreases, and production cost increases.

Embodiment 1

FIGS. 2A through 2H are cross-sectional views illustrating an organic light emitting display device (OLED) having a bottom gate type complementary metal oxide semiconductor thin film transistor (CMOS TFT) and a method of fabricating the same according to one embodiment.

Figure 2A:
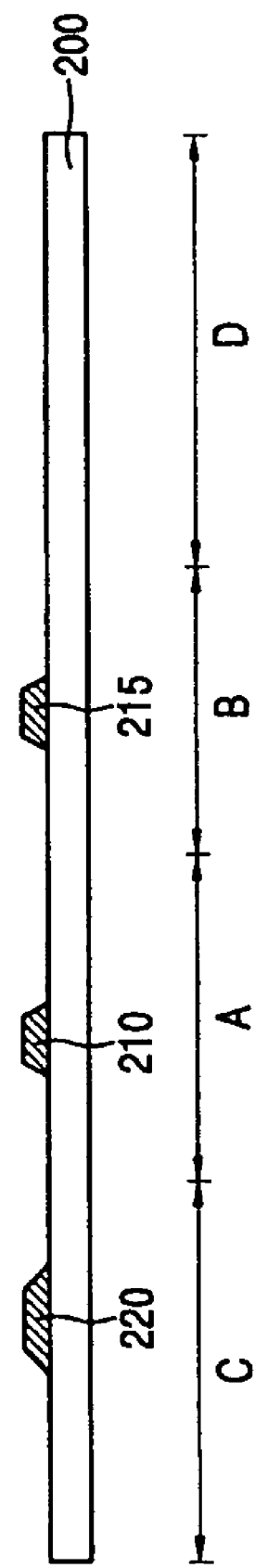
Figure 2B:
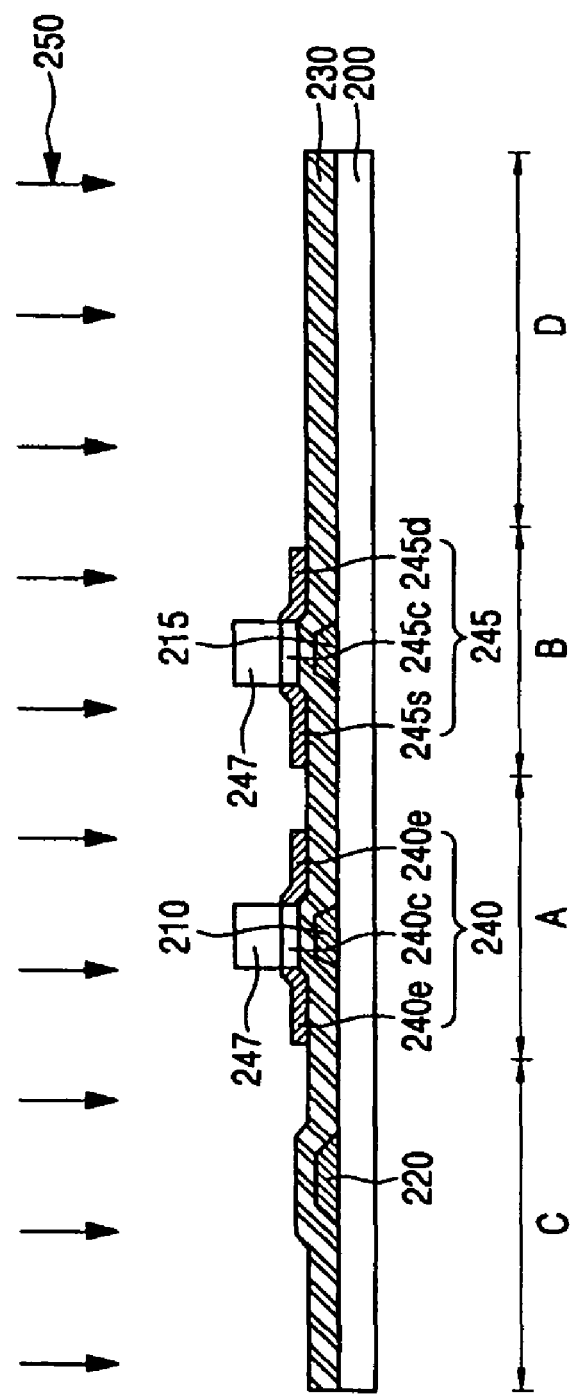
Figure 2C:
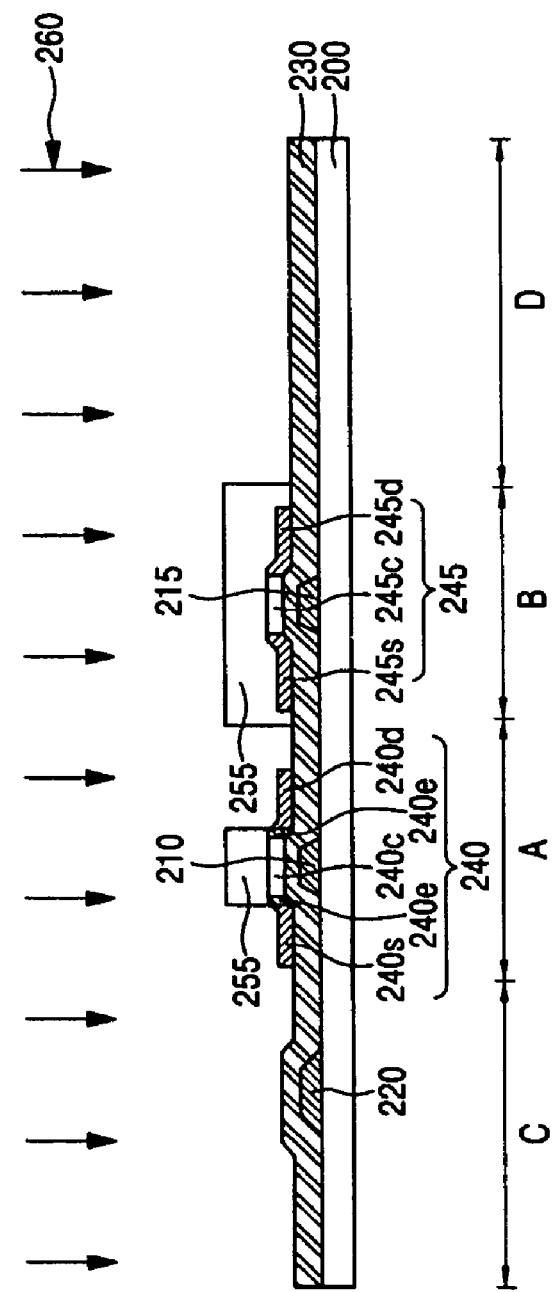
Figure 2D:
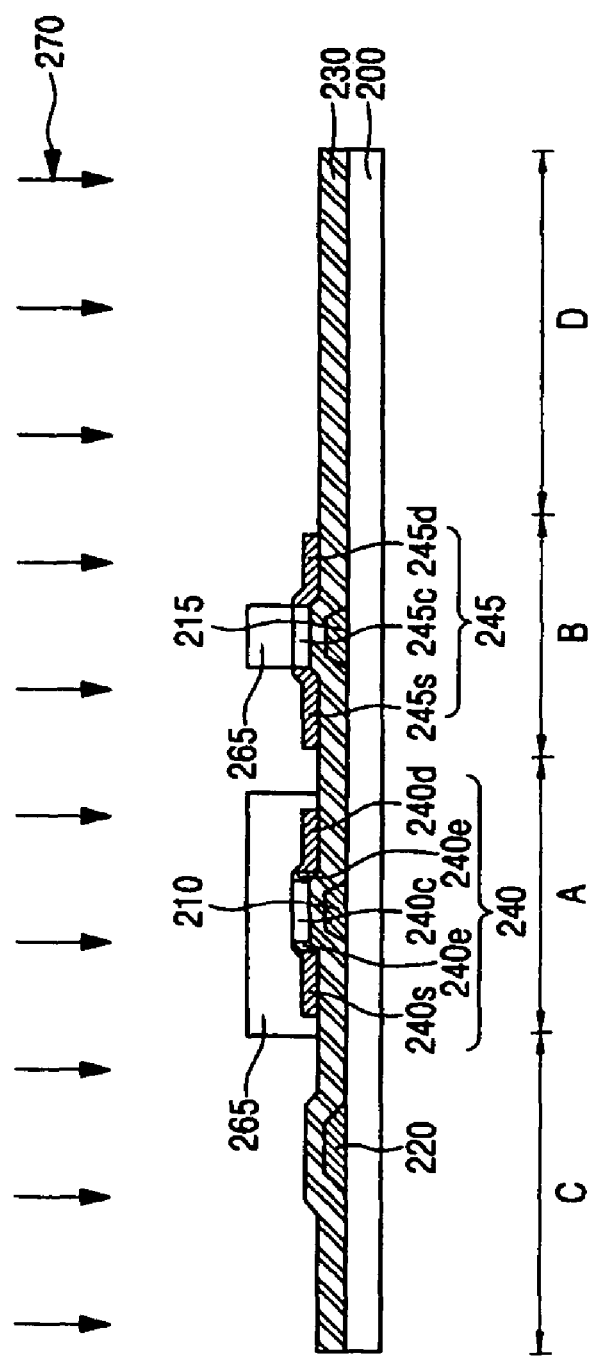
Figure 2E:
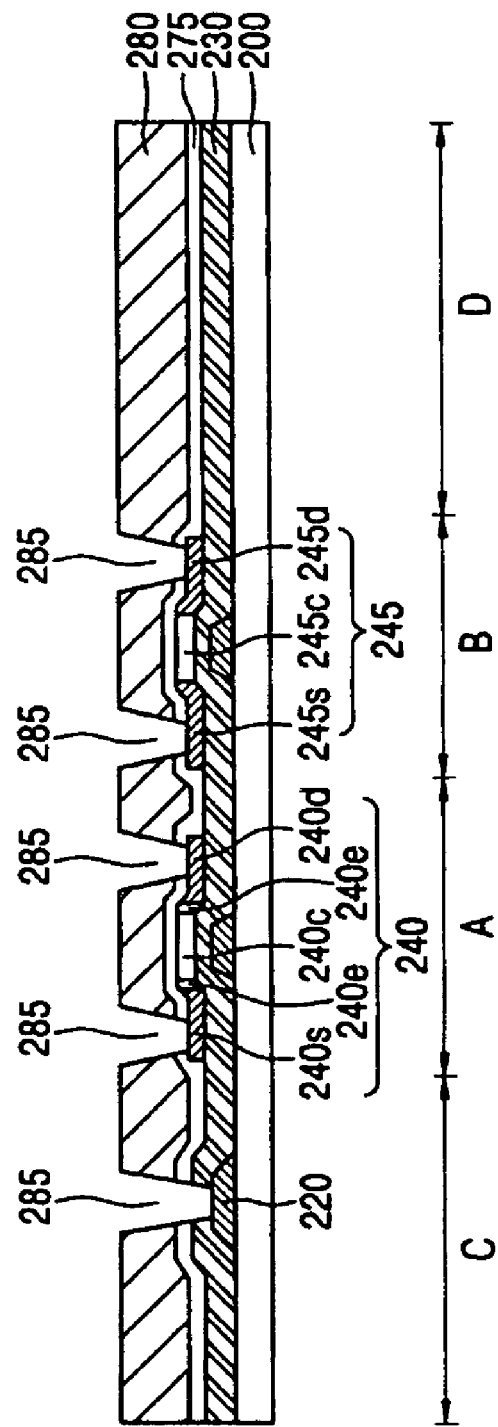
Figure 2H:
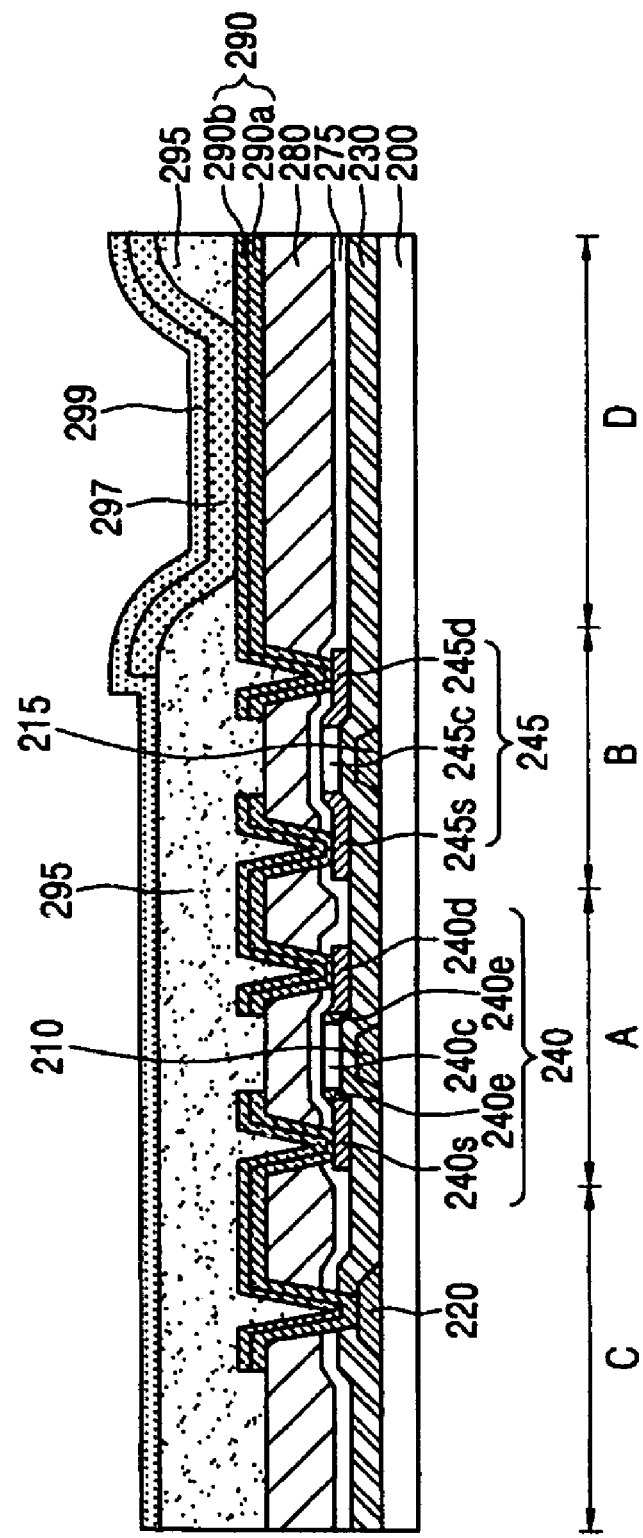

Referring to FIG. 2H, an organic light emitting display device (OLED) according to one embodiment is described. The OLED includes a substrate 200; a first thin film transistor 240 formed over the substrate 200; an electrically conductive line 220 formed over the substrate 200; a planarization layer 280 formed over the first thin film transistor 240 and the electrically conductive line 220; and a first interconnection electrically interconnecting the electrically conductive line 220 and the first thin film transistor 240. In the illustrated embodiment, the first interconnection includes: a first portion formed over the planarization layer 280, a second portion connecting between the first portion and the electrically conductive line 220 through the planarization layer 280, and a third portion connecting between the first portion and a portion 240s of the first thin film transistor 240.

Referring to FIGS. 2A through 2H, the OLED having the bottom gate type CMOS TFT includes a substrate 200. The substrate 200 includes a first TFT region A, a second TFT region B, an opening region D, and an interconnection region C. The substrate 200 may be a transparent substrate, which is formed of glass, plastic material, or quartz.

Referring to FIG. 2A, a first gate electrode 210, a second gate electrode 215, and an electrically conductive line 220 are formed and then patterned using a first mask (not shown) in the first and second TFT regions A and B of the substrate 200. The first and second gate electrodes 210 and 215 may be formed of one material selected from the group consisting of molybdenum (Mo), tungsten (W), aluminum (Al), and an alloy thereof, for example, tungsten molybdenum (MoW), molybdenum (Mo), tungsten (W), tungsten silicide ($WSi_2$), molybdenum silicide ($MoSi_2$), and aluminum (Al). The first and second gate electrodes 210 and 215 may be formed by a sputtering method or a vacuum deposition method. In one embodiment, the first and second gate electrodes 210 and 215 may be formed by depositing a material using a sputtering method and then patterning the deposited material.

The first mask forms a photoresist pattern according to a pattern formed on a reticle by a photolithography process. Then, the photoresist pattern is removed by ashing and photoresist stripping processes.

During the formation of the first and second gate electrodes 210 and 215, the electrically conductive line 220 may be formed in the interconnection region C of the substrate 200. The electrically conductive line 220 may be formed a predetermined distance apart from the first and second gate electrodes 210 and 215 on the same layer as the first and second gate electrodes 210 and 215. The electrically conductive line 220 may be formed by depositing the same material as the first and second gate electrodes 210 and 215 and then patterning the material using the first mask. The electrically conductive line 220 will serve to provide power to a source or drain of a thin film transistor which will be formed as described below.

Referring to FIG. 2B, a gate insulating layer 230 is formed on the substantially entire surface of the substrate 200 having the first and second gate electrodes 210 and 215 and the electrically conductive line 220. The gate insulating layer 230 may be a silicon oxide layer, a silicon nitride layer, or a stacked layer thereof. The gate insulating layer 230 may be formed by a plasma-enhanced chemical vapor deposition (PECVD) process or a low-pressure CVD (LPCVD) process.

A first semiconductor layer 240 and a second semiconductor layer 245 may be formed using a second mask (not shown) on the gate insulating layer 230 in the first and second TFT regions A and B, respectively. In one embodiment, the first and second semiconductor layers 240 and 245 may be formed of amorphous silicon (a-Si) or polycrystalline Si (poly-Si). The first and second semiconductor layers 240 and 245 may be formed by depositing a-Si using a PECVD process, crystallizing the a-Si into a poly-Si layer using a crystallization method, and patterning the poly-Si layer using the second mask. In this case, the deposition of the a-Si using the PECVD process may be followed by dehydrogenation of the a-Si using an annealing process to lower the concentration of hydrogen.

Thereafter, the second mask, which has been used to pattern the first and second semiconductor layers 240 and 245, is positioned under the substrate 200, and a back exposure process using the second mask and the first and second gate electrodes 210 and 215 as masks is carried out to form a first photoresist pattern 247 corresponding to the first and second gate electrodes 210 and 215 on predetermined regions of the first and second semiconductor layers 240 and 245 in the first and second TFT regions A and B.

More specifically, the back exposure process includes positioning the second mask, which has been used to pattern the first and second semiconductor layers 240 and 245, under the substrate 200 and irradiating light toward a bottom of the substrate 200. Thus, the first photoresist pattern 247 is formed on the predetermined regions of the first and second semiconductor layers 240 and 245 corresponding to the first and second gate electrodes 210 and 215 in the first and second TFT regions A and B. The first photoresist pattern 247 may be formed of a positive photosensitive material. Thus, when a portion of the first photoresist pattern 247 is exposed to light, the portion changes into a material soluble in a developing solution and thus is etched. In one embodiment, the photosensitive material may include a solvent, a photosensitive compound, and a polymer resin. The photosensitive compound may include acrylic resin or polyimide (PI).

Accordingly, portions of the photoresist which are positioned over the gate insulating layer 230 that transmits light incident from the bottom of the substrate 200 or over a region of the semiconductor layer that does not correspond to the gate electrode, are exposed to light. The portions change into a material soluble in a developing solution, and are etched during the back exposure process. On the other hand, since the first and second gate electrodes 210 and 215 formed in the first and second TFT regions A and B of the substrate 200, are formed of a metal and do not transmit light, portions of the photoresist over the gate electrodes 210 and 215 are not exposed to light incident from the bottom of the substrate 200. Thus, the first photoresist pattern 247 is formed to the same size as the first and second electrodes 210 and 215.

By performing a first impurity implantation process 250 using the first photoresist pattern 247 obtained by the back exposure process, lightly doped drain (LDD) impurity ions are implanted into the first and second semiconductor layers 240 and 245. Thus, LDD regions 240e and a first channel region 240c are formed in the first TFT region A, and second source and drain regions 245s and 245d and a second channel region 245c are formed in the second TFT region B. The first impurity implantation process 250 may be carried out using typical n-type impurity ions, for example, $PH_3$ ions. In particular, the LDD regions 240e are formed to improve the characteristics of a TFT. Also, because the first photoresist pattern 247 is formed by the back exposure process after the formation of the first and second semiconductor layers 240 and 245, LDD impurity ions can be implanted into the first semiconductor layer 240 in the first TFT region A without an additional mask, so that one process mask can be saved compared to the method of FIG. 1A-1K.

In another embodiment where the back exposure process is unnecessary or cannot be used, the first photoresist pattern 247 may be formed using a mask for a photoresist pattern.

Referring to FIG. 2C, the first photoresist pattern 247 is removed, and a second photoresist pattern 255 is formed using a third mask (not shown). In one embodiment, the second photoresist pattern 255 is formed to have a slightly greater width than the first channel region 240c on the first semiconductor 240 in the first TFT region A to completely cover the first channel region 240c and partially cover the LDD regions 240e. Also, the second photoresist pattern 255 is formed to completely cover the second semiconductor layer 245 in the second TFT region B.

Thereafter, n-type impurity ions are implanted into exposed portions of the LDD regions 240e in the first TFT region A using the second photoresist pattern 255. The n-type impurity ions include one material selected from the group consisting of phosphorus (P), arsenic (As), antimony (Sb), and bismuth (Bi). The concentration of the n-type impurity ions is higher than that of the LDD impurity ions. As a result, an NMOS transistor including the first source and drain regions 240s and 240d, which are doped with n-type impurity ions, the LDD regions 240e, which are doped with LDD impurity ions, and the first channel region 240c, which is interposed between the LDD regions 240e, is formed in the first semiconductor layer 240. On the other hand, the second semiconductor layer 245 formed in the second TFT region B, which is covered by the second photoresist pattern 255, is not doped with the n-type impurity ions.

Referring to FIG. 2D, the second photoresist pattern 255 is removed, and a third photoresist pattern 265 is formed using a fourth mask (not shown). The third photoresist pattern 265 covers the second channel region 245c, which has been defined in the second semiconductor layer 245 of the second TFT region B through the first impurity implantation process 250, exposes the second source and drain regions 245s and 245d, and completely covers the first semiconductor layer 240 in the first TFT region A.

Subsequently, a third impurity implantation process 270 is performed using the third photoresist pattern 265 so that p-type impurity ions are implanted into the second source and drain regions 245s and 245d of the second TFT region B. The p-type impurity ions may include one selected from the group consisting of boron (B), aluminum (Al), gallium (Ga), and indium (In). The concentration of the p-type impurity ions is higher than that of the LDD impurity ions. Thus, a PMOS transistor including the second source and drain regions 245s and 245d, which are doped with p-type impurity ions, and the second channel region 245c, which is interposed between the second source and drain regions 245s and 245d, is formed in the second semiconductor layer 245. On the other hand, the first semiconductor layer 240 formed in the first TFT region, which is covered by the third photoresist pattern 265, is not doped with the p-type impurity ions.

As a result, a CMOS TFT having both the NMOS transistor formed in the first TFT region A and the PMOS transistor formed in the second TFT region B is formed.

Referring to FIG. 2E, a passivation layer 275 may be formed on the first and second semiconductor layers 240 and 245. Typically, the passivation layer 275 is formed to prevent TFTs from external contamination. The passivation layer 275 may be formed of an inorganic insulating layer, for example, a silicon nitride layer, a silicon oxide layer, or a stacked layer thereof. The passivation layer 275 may be formed by a PECVD process or an LPCVD process. In one embodiment, the passivation layer 275 may be obtained by depositing an inorganic insulating material, annealing the material, and hydrogenating the annealed material.

A planarization layer 280 may be formed on the passivation layer 275 to reduce steps. The planarization layer 280 may be formed of one organic material selected from the group consisting of benzocyclobutane (BCB), PI, polyamide (PA), acrylic resin, and phenolic resin. The planarization layer 280 may be formed by a spin coating process.

Thereafter, the passivation layer 275 and the planarization layer 280, which have been formed in the first and second TFT regions A and B and the interconnection region D, may be etched using a fifth mask (not shown), thereby forming contact holes 285 in the passivation layer 275 and the planarization layer 280 to expose portions of the first and second source and drain regions 240s, 240d, 245s, and 245d and the electrically conductive line 220.

Referring to FIG. 2F, a first electrode material layer 290 including a reflective layer 290a and a transparent layer 290b may be deposited in the contact holes 285 and then is patterned by blanket etching, thereby forming a first electrode 291, a first interconnection 292, and a second interconnection 293.

The reflective layer 290a may be formed of a metal with high reflectance, which is one selected from the group consisting of aluminum (Al), silver (Ag), and an alloy thereof. Also, the transparent layer 290b may be formed of one of ITO and IZO. Thus, the first electrode 291 is formed as a reflective anode. The reflective layer 290a and the transparent layer 290b may be sequentially deposited by a sputtering method, a vacuum deposition method, or an ion plating method. In one embodiment, the reflective layer 290a and the transparent layer 290b are formed by a sputtering method.

The reflective layer 290a of the first electrode material layer 290 may be formed of Ag such that the reflective layer 290a can be patterned with the transparent layer 290b by blanket etching. The transparent layer 290b may be formed of ITO. In one embodiment, the first electrode material layer 290 may be formed by sequentially depositing Ag and ITO using a sputtering method and then wet- or dry-etching the Ag layer and the ITO layer through blanket etching using a sixth mask (not shown). The blanket etching may make use of an ordinary etching process. By blanket-etching the first electrode material layer 290 including the reflective layer 290a and the transparent layer 290b, one process mask can be saved during the formation of the first electrode 291, compared to the method of FIG. 1A-1K.

As a result, the first electrode material layer 290 is patterned to form the first interconnection 292 and the second interconnection 293. The first interconnection 292 connects the electrically conductive line 220 formed in the interconnection region C with one of the first source and drain regions 240s and 240d (e.g., the first source region 240s) of the first semiconductor layer 240 formed in the first TFT region A. Also, the second interconnection 293 connects the other of the first source and drain regions 240s and 240d (e.g., the first drain region 240d) of the first semiconductor layer 240 formed in the first TFT region A with one of the second source and drain regions 245s and 245d (e.g. the second source region 245s) of the second semiconductor layer 245 formed in the second TFT region B.

When forming the first electrode 291, which is a reflective anode contacting the second source and drain regions 245s and 245d, the process of forming the contact holes for connecting the second source and drain regions 245s and 245 with source and drain electrodes and the process of forming the source and drain electrodes may be omitted so that one process mask can be further saved, compared to the method of FIG. 1A-1K.

Referring to FIG. 2G, a pixel defining layer 295 is formed over the substantially entire surface of the substrate 200 to expose a predetermined region of the first electrode 291. The pixel defining layer 295 may be formed of one organic material selected from the group consisting of BCB, PI, PA, acrylic resin, and phenolic resin. The pixel defining layer 295 may be formed by depositing an organic material using a spin coating process and then etching using a seventh mask so that an opening P is formed in the opening region C to expose a portion of the surface of the first electrode 291. The opening P may be formed by a dry or wet etching process, optionally, a wet etching process.

Referring to FIG. 2H, an organic layer 297 including at least an organic emission layer (EML) and a second electrode 299 may be formed on the exposed portion of the first electrode 291 in the opening P. In addition to the EML, the organic layer 297 may further include at least one of an electron injection layer (EIL), an electron transport layer (ETL), a hole transport layer (HTL), and a hole injection layer (HIL).

The EML may be formed of a low molecular substance or a high molecular substance. The low molecular substance may be one selected from the group consisting of tris(8-hydroxyquinoline) aluminum (Alq3), anthracene, cyclo pentadiene, ZnPBO, Balq, and DPVBi. The high molecular substance may be one selected from the group consisting of polythiophene (PT), poly(p-phenylenevinylene) (PPV), polyphenylene (PPP), and derivatives thereof. The organic layer 297 may be formed by a vacuum deposition method, a spin coating method, an inkjet printing method, or a laser induced thermal imaging (LITI) method. In one embodiment, the organic layer 297 may be formed by a spin coating method. Also, the organic layer 297 may be patterned by an LITI method or a vacuum deposition method using a shadow mask.

The second electrode 299 is a thin transmissive electrode, which may be formed of one selected from the group consisting of Mg, Ca, Al, Ag, and an alloy thereof. Also, the second electrode 299 may be formed by a vacuum deposition method.

The substrate 200 having the second electrode 299 is encapsulated with an upper substrate using any suitable method. Thus, a top-emitting OLED having the bottom gate type CMOS TFT with the LDD regions according to the embodiment is completed using seven masks (or using eighth masks if the back exposure process is not used).

Embodiment 2

FIGS. 3A through 3I are cross-sectional views illustrating an OLED having a top gate type CMOS TFT and a method of fabricating the same according to another embodiment.

Figure 3A:
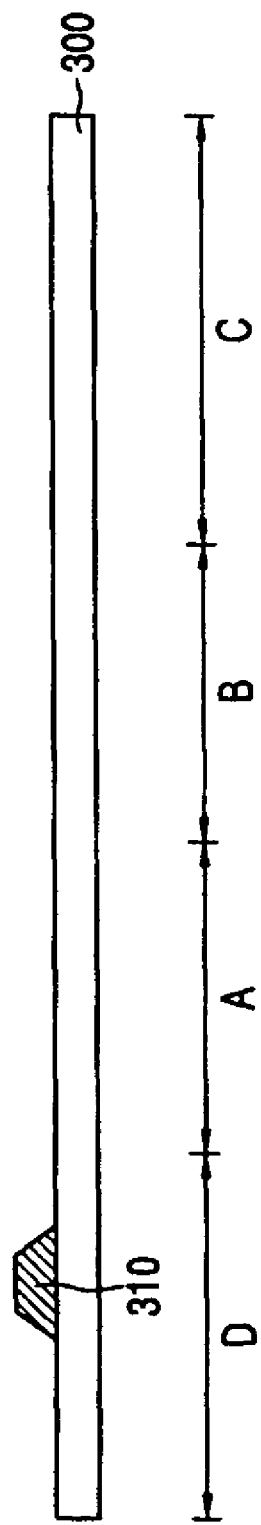

Referring to FIG. 3A, the OLED having a top gate type CMOS TFT includes a substrate 300 having a first TFT region A, a second TFT region B, an opening region C, and an interconnection region D. The substrate 300 may be a transparent substrate, which is formed of glass, plastic material, or quartz.

An electrically conductive line 310 may be formed using a first mask (not shown) in the interconnection region D of the substrate 300. The electrically conductive line 310 may be formed of one material selected from the group consisting of Mo, W, Al, and an alloy thereof. The electrically conductive line 310 may be formed by a sputtering method or a vacuum deposition method. In one embodiment, the electrically conductive line 310 may be formed by depositing a material using a sputtering method and patterning the deposited material.

Figure 3B:
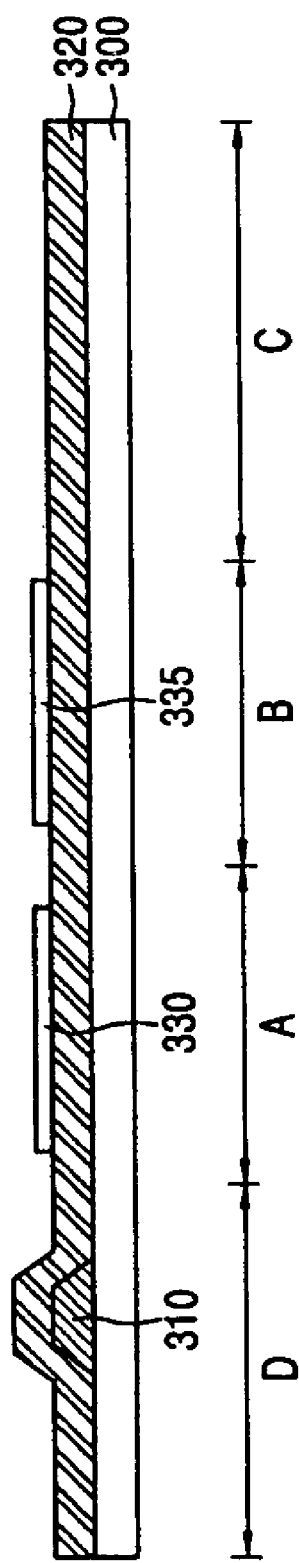

Referring to FIG. 3B, a buffer layer 320 may be formed on the substantially entire surface of the substrate 300 having the electrically conductive line 310. Then, a first semiconductor layer 330 and a second semiconductor layer 335 are formed and then patterned, using a second mask (not shown), on the buffer layer 320 in the first and second TFT regions A and B.

The buffer layer 320 may be formed to protect a TFT that will be formed later from impurity ions diffusing from the substrate 300. The buffer layer 320 may be a silicon oxide layer, a silicon nitride layer, or a stacked layer thereof. The buffer layer 320 may be formed by a PECVD process or an LPCVD process. The method of forming the first and second semiconductor layers 330 and 335 may be as described above with respect to Embodiment 1.

Referring to FIG. 3C, a first photoresist pattern 340 may be formed using a third mask (not shown) to expose a predetermined region of the first semiconductor layer 330 in the first TFT region A. Then, a first impurity implantation process 345 may be carried out using the first photoresist pattern 340 so that n-type impurity ions are implanted into the first semiconductor layer 330. The n-type impurity ions may include one selected from the group consisting of P, As, Sb, and Bi. Thus, the first semiconductor layer 330 includes first source and drain regions 330s and 330d, which are doped with the n-type impurity ions, and a first channel region 330c, which is interposed between the first source and drain regions 330s and 330d. On the other hand, the second semiconductor layer 335 formed in the second TFT region B, which is covered by the first photoresist pattern 340, is not doped with the n-type impurity ions.

Figure 3D:
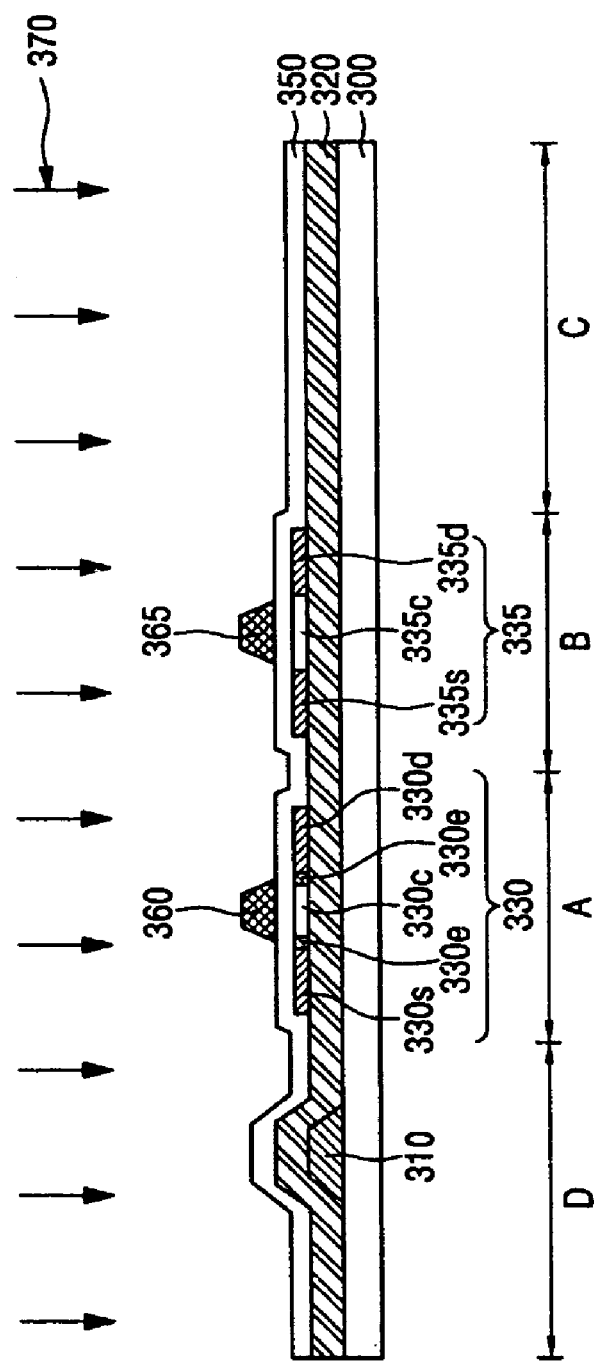

Referring to FIG. 3D, after the first impurity implantation process 345, the first photoresist pattern 340 may be removed by ashing and PR stripping processes. A gate insulating layer 350 may be formed over the substantially entire surface of the substrate 300 having the first and second semiconductor layers 330 and 335. The gate insulating layer 350 may be a silicon oxide layer, a silicon nitride layer, or a stacked layer thereof. Also, the gate insulating layer 350 may be formed by a PECVD process or an LPCVD process.

A first gate electrode 360 and a second gate electrode 365 may be formed using a fourth mask (not shown) on the gate insulating layer 350 in the first and second TFT regions A and B. The first and second gate electrodes 360 and 365 may be formed of one material selected from the group consisting of Mo, W, Al, and an alloy thereof. In one embodiment, the first gate electrode 360 formed in the first TFT region A is formed to have a smaller width than the first channel region 330c shown in FIG. 3C to leave spaces for LDD regions that will be formed later. The first and second gate electrodes 360 and 365 may be formed by a sputtering method or a vacuum deposition method. In one embodiment, the first and second gate electrodes 360 and 365 are formed by depositing a material using a sputtering method and patterning the deposited material.

A second impurity implantation process 370 may be performed in the first and second TFT regions A and B using the first and second gate electrodes 360 and 365 as masks, so that LDD regions 330e are formed in the first semiconductor layer 330. Impurity ions doped into the LDD regions 330e may be n-type impurity ions, for example, $PH_3$. The concentration of the LDD impurity ions may be lower than that of the n-type impurity ions. Thus, the first semiconductor layer 330 formed in the first TFT region A forms an NMOS transistor including the first source and drain regions 330s and 330d, which are doped with n-type impurity ions, the LDD regions 330e, which are doped with low-concentration impurity ions, and the first channel region 330c, which is interposed between the LDD regions 330e. As the result of the second impurity implantation process 370, the second semiconductor layer 335 formed in the second TFT region B includes second source and drain regions 335s and 335d and a second channel region 335c, which is interposed between the second source and drain regions 335s and 335d.

Referring to FIG. 3E, a second photoresist pattern 375 may be formed using a fifth mask (not shown) to substantially completely cover the first semiconductor layer 330 in the first TFT region A while exposing the second semiconductor layer 335 in the second TFT region B. A third impurity implantation process 380 may be performed using the second photoresist pattern 375 on the second semiconductor layer 335 in the second TFT region B so that p-type impurity ions are implanted to form the second source and drain regions 335s and 335d. The p-type impurity ions may include one selected from the group consisting of B, Al, Ga, and In. The concentration of the p-type impurity ions may be higher than that of the LDD impurity ions. Thus, the second semiconductor layer 335 forms a PMOS transistor including the second source and drain regions 335s and 335d, which are doped with the p-type impurity ions, and the second channel region 335c, which is interposed between the second source and drain regions 335s and 335d. As described above, a CMOS TFT having both the NMOS transistor formed in the first TFT region A and the PMOS transistor formed in the second TFT region B is formed.

Figure 3F:
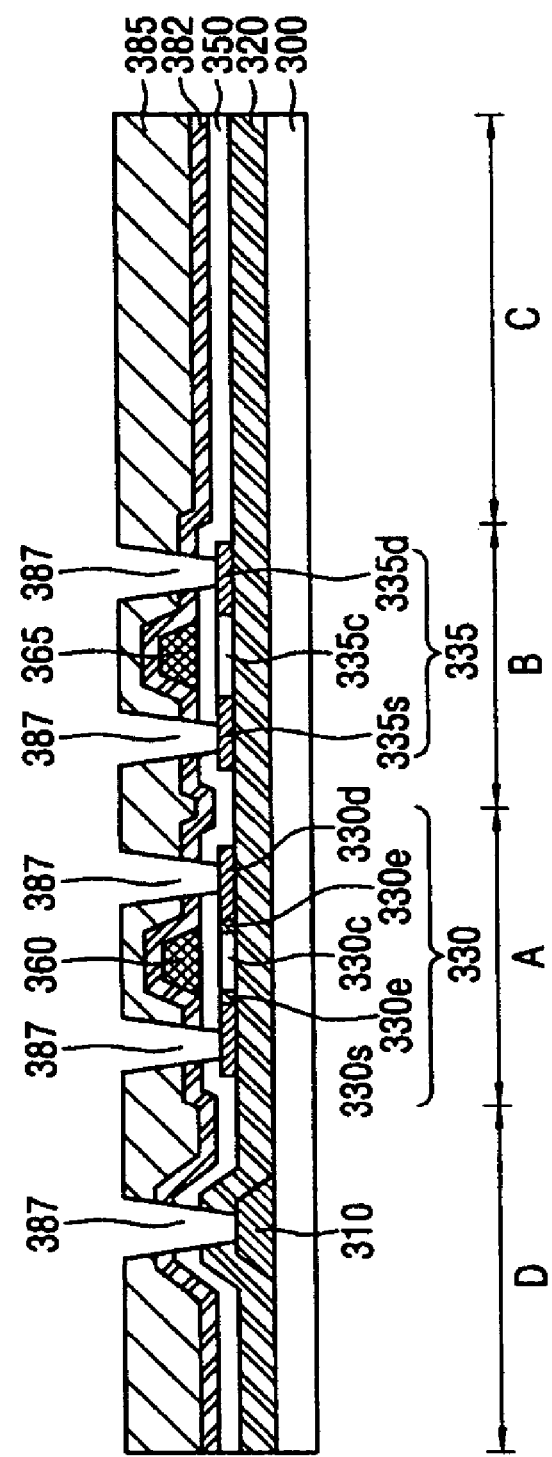

Referring to FIG. 3F, a passivation layer 382 may be formed on the first and second gate electrodes 360 and 365, and then a planarization layer 385 may be formed on the passivation layer 382. The passivation layer 382 and the planarization layer 385 may be etched using a sixth mask (not shown), thereby forming contact holes 387 to expose portions of the first and second source and drain regions 330s, 330d, 335s, and 335d and the electrically conductive line 310. The methods of forming the passivation layer 382, the planarization layer 385, and the contact holes 387 may be the same as those described in Embodiment 1.

Referring to FIG. 3G, a first electrode material layer 390 including a reflective layer 390a and a transparent layer 390b may be stacked in the contact holes 387, and then is patterned by a blanket etching process using a seventh mask (not shown), thereby forming a first electrode 391, a first interconnection 392, and a second interconnection 393.

The formation and patterning of the first electrode material layer 390 may be the same as those described in Embodiment 1. The first electrode material layer 390 including the reflective layer 390a and the transparent layer 390b may be blanket-etched, so that one process mask can be saved during the formation of the first electrode 391, compared to the method of FIG. 1A-1K.

The first electrode 391 may be in contact with one of the second source and drain regions 335s and 335d of the second semiconductor layer 335 in the second TFT region B. The first interconnection 392 may be in contact with the electrically conductive line 310 in the interconnection region C and one of the first source and drain regions 330s and 330d in the first TFT region A. Also, the second interconnection 393 may be in contact with the other of the first source and drain regions 330s and 330d in the first TFT region A and the other of the second source and drain regions 335s and 335d in the second TFT region B.

Since the first electrode 391, the first interconnection 392, and the second interconnection 393 are formed at the same time, the process of forming the contact holes for connecting the source and drain regions with source and drain electrodes and the process of forming the source and drain electrodes can be omitted. Thus, two process masks can be further saved, compared to the method of FIG. 1A-1K.

Figure 3H:
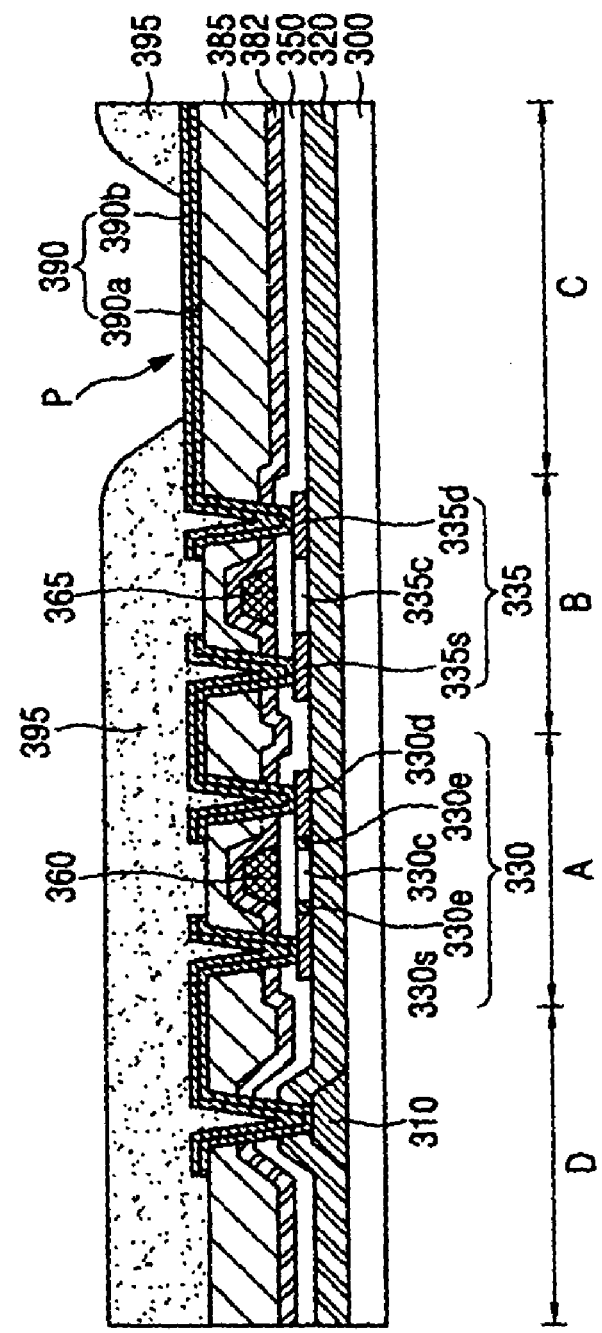
Figure 31:
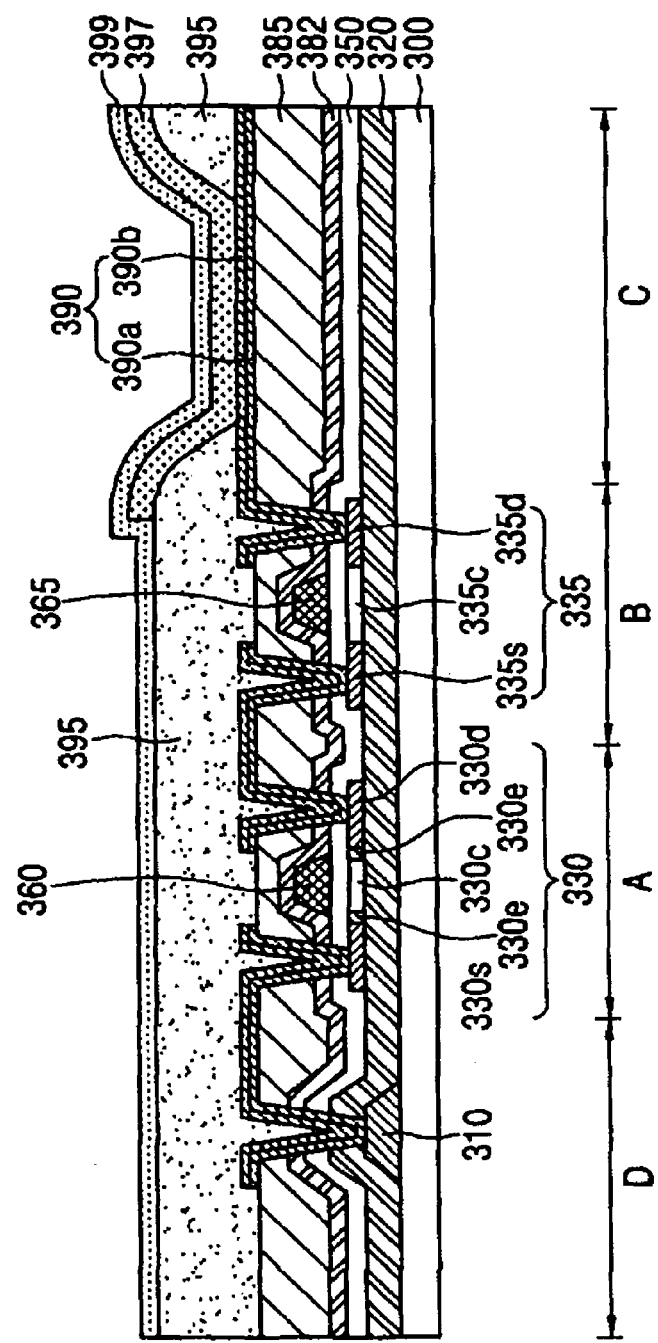

Referring to FIG. 3H, a pixel defining layer 395 may be formed over the substantially entire surface of the substrate 300 having the first electrode 391. The method of forming the pixel defining layer 395 may be the same as that described in Embodiment 1. The pixel defining layer 395 may be etched using an eighth mask (not shown) so that an opening P is formed in the opening region C to expose a portion of the surface of the first electrode 391. The opening P may be formed by a dry or wet etching process.

Referring to FIG. 3I, an organic layer 397 having at least an EML and a second electrode 399 may be formed on the exposed portion of the first electrode 391 in the opening P. The methods of forming the organic layer 397 and the second electrode 399 may be the same as those described in Embodiment 1.

The substrate 300 having the second electrode 399 may be encapsulated with an upper substrate using any suitable method. Thus, a top-emitting OLED having the top gate type CMOS TFT with the LDD regions according to another embodiment is completed using eighth process masks.

According to the embodiments as described above, when a first electrode that is a reflective anode is formed, interconnections are brought into contact with internal devices at the same time. Thus, an OLED having a CMOS TFT with LDD regions can be formed using only 7 to 8 process masks compared to the OLED of FIG. 1A-1K using 11 to 12 process masks. As a result, an overall fabrication process can be shortened, the production cost can be reduced, and yield can increase.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:
1. An organic light emitting display device, comprising:
a substrate;
a first thin film transistor formed over the substrate;
an electrically conductive line formed over the substrate, wherein the electrically conductive line is configured to provide power to the first thin film transistor;
a planarization layer formed over the first thin film transistor and the electrically conductive line;
a pixel electrode formed on and contacting the planarization layer;
an organic light emitting layer formed over the pixel electrode; and
a first interconnection electrically interconnecting the electrically conductive line and the first thin film transistor, wherein the first interconnection comprises:
a first portion formed on and contacting the planarization layer,
a second portion connecting the first portion and the electrically conductive line through the planarization layer, and
a third portion connecting the first portion and a part of the first thin film transistor,
wherein the first thin film transistor comprises a source, a drain and a channel located therebetween,
wherein the electrically conductive line is located below the source, the drain and the channel, and
wherein the pixel electrode is formed of a material and the first interconnection is formed of the material.
2. The device of claim 1, wherein the part of the first thin film transistor comprises the source or the drain.
3. The device of claim 1, wherein the first thin film transistor comprises a gate electrode, and wherein the electrically conductive line is formed simultaneously with the gate electrode.
4. The device of claim 1, further comprising a second thin film transistor formed between the substrate and the planarization layer.
5. The device of claim 4, wherein the first thin film transistor comprises an NMOS transistor, and wherein the second thin film transistor comprises a PMOS transistor.
6. The device of claim 4, further comprising a second interconnection electrically interconnecting the first thin film transistor and the second thin film transistor, wherein the second interconnection comprises:
a first portion formed over the planarization,
a second portion connecting the first portion and the first thin film transistor through the planarization layer, and
a third portion connecting the first portion and the second thin film transistor.
7. The device of claim 4, further comprising a second interconnection, wherein the second interconnection electrically interconnects the pixel electrode and the first or second thin film transistor, the second interconnection comprising a portion formed through the planarization layer.
8. The device of claim 7, wherein the second interconnection comprises a material, and wherein the pixel electrode comprises the same material.
9. The device of claim 7, wherein the pixel electrode and the second interconnection are continuous.
10. The device of claim 7, wherein the second interconnection comprises a first layer comprising a first material and a second layer comprising a second material, and wherein the pixel electrode comprises a first layer comprising the first material and a second layer comprising the second material.
11. The device of claim 10, wherein the first material comprises one or more selected from the group consisting of Al, Ag, an Al alloy, and an Ag alloy.
12. The device of claim 10, wherein the second material comprises ITO or IZO.
13. The device of claim 1, wherein the pixel electrode comprises an extended surface, substantially the entire extended surface being formed on and contacting the planarization layer.
14. The device of claim 1, wherein the first thin film transistor comprises a gate electrode formed over the substrate, and the part of the first thin film transistor is formed on a layer over the electrically conductive line.

* * * * *